(12) United States Patent
Takeda et al.

(10) Patent No.: US 12,744,182 B2
(45) Date of Patent: Sep. 22, 2026

(54) SUBSTRATE PROCESSING APPARATUS, METHOD OF MANUFACTURING SEMICONDUCTOR DEVICE AND PLASMA GENERATING APPARATUS

(71) Applicant: Kokusai Electric Corporation, Tokyo (JP)

(72) Inventors: Tsuyoshi Takeda, Toyama (JP); Daisuke Hara, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 636 days.

(21) Appl. No.: 18/170,289

(22) Filed: Feb. 16, 2023

(65) Prior Publication Data

US 2023/0197408 A1 Jun. 22, 2023

Related U.S. Application Data

(63) Continuation of application No. PCT/JP2020/034472, filed on Sep. 11, 2020.

(51) Int. Cl.
*H01J 37/32* (2006.01)
*H10P 72/76* (2026.01)

(52) U.S. Cl.
CPC ..... *H01J 37/3211* (2013.01); *H01J 37/32119* (2013.01); *H01J 37/32174* (2013.01);
(Continued)

(58) Field of Classification Search
CPC ............ H01J 37/3211; H01J 37/32119; H01J 37/32174; H01J 37/32568;
(Continued)

(56) References Cited

U.S. PATENT DOCUMENTS 4,715,921 A * 12/1987 Maher ................. H01L 21/6719 156/345.32
5,309,063 A * 5/1994 Singh .................... H01J 37/321 315/111.41

(Continued)

FOREIGN PATENT DOCUMENTS

CN 101877312 A 11/2010
GB 2317265 A * 3/1998 ............ H01J 37/321

(Continued)

OTHER PUBLICATIONS

TIPO Office Action with English translation in Taiwan Application No. 110129788, dated May 2, 2022, 14 pages.

(Continued)

*Primary Examiner* — Kurt Sweely
(74) *Attorney, Agent, or Firm* — Edell, Shapiro & Finnan, LLC

(57) ABSTRACT

According to one aspect of the technique of the present disclosure, there is provided a substrate processing apparatus including: a process chamber in which a substrate is processed; a gas supplier through which a process gas is supplied to the process chamber; a plasma generator provided so as to protrude into the process chamber, constituted by a coil and an insulator, and configured to generate a plasma of the process gas in the process chamber; and an adjuster capable of adjusting a gap distance between the coil and the insulator.

19 Claims, 8 Drawing Sheets

(52) U.S. Cl.
CPC .. *H01J 37/32568* (2013.01); *H01J 37/32651* (2013.01); *H01J 37/321* (2013.01); *H01J 37/32183* (2013.01); *H01J 37/3244* (2013.01); *H10P 72/7612* (2026.01)

(58) Field of Classification Search
CPC ............... H01J 37/32651; H01J 37/321; H01J 37/32183; H01J 37/3244; H01J 37/32633; H01J 37/32834; H01J 37/32–3299; C23C 16/45591; C23C 16/4585; H10P 72/7612
See application file for complete search history.

(56) References Cited

U.S. PATENT DOCUMENTS 5,589,737 A * 12/1996 Barnes ................ H01J 37/3222 219/121.52
5,637,961 A * 6/1997 Ishii .................. H01J 37/32174 315/111.21
5,647,913 A * 7/1997 Blalock .................... H05H 1/46 118/723 MP
5,800,621 A * 9/1998 Redeker ................ H01J 37/321 118/723 AN
5,968,327 A * 10/1999 Kobayashi .......... H01J 37/3408 204/298.11
6,150,763 A * 11/2000 Leou ..................... H01J 37/321 315/111.21
6,158,384 A * 12/2000 Ye ..................... H01J 37/32477 118/723 AN
6,229,264 B1 * 5/2001 Ni ..................... H01J 37/32266 118/723 AN
7,419,551 B2 * 9/2008 Chandrachood ............................ H01L 21/68764 156/345.55
7,829,815 B2 * 11/2010 Chen ..................... H01J 37/321 219/121.48
9,171,734 B1 * 10/2015 Toyoda ............ H01L 21/02274
9,496,121 B2 * 11/2016 Kim ..................... H01J 37/3211
12,068,136 B2 * 8/2024 Takeda .............. H01J 37/32449
2010/0269980 A1 * 10/2010 Nishimura ........ H01J 37/32174 156/345.48
2012/0121231 A1 5/2012 Saitoh et al.
2013/0087097 A1 * 4/2013 Kato ................ C23C 16/45544 118/719
2013/0267098 A1 * 10/2013 Maeda .............. H01L 21/02104 438/758
2014/0150975 A1 * 6/2014 Ebe ...................... H01J 37/3211 156/345.48
2014/0356550 A1 12/2014 Tonegawa et al.
2015/0093913 A1 4/2015 Toyoda et al.
2018/0073146 A1 * 3/2018 Kato ..................... H01J 37/321
2021/0202213 A1 7/2021 Takeda
2024/0222087 A1 * 7/2024 Takeda ............. H01J 37/32522

FOREIGN PATENT DOCUMENTS

JP 07245271 A 9/1995
JP 10-050496 A 2/1998
JP 2010-258324 A 11/2010
JP 2015-92533 A 5/2015
KR 10-2010-0118545 A 11/2010
KR 10-2014-0141515 A 12/2014
WO 98/11764 A1 3/1998
WO 2011/013458 A1 2/2011
WO 2011/013468 A1 2/2011
WO 2020/059174 A1 3/2020

OTHER PUBLICATIONS

First Office Action with English translation in Chinese Application No. 202080102790.8, dated Mar. 1, 2025, 24 pages.
Request for the Submission of an Opinion with English translation in Korean Application No. 10-2023-7005237, dated Feb. 21, 2025, 27 pages.

* cited by examiner

SUBSTRATE PROCESSING APPARATUS, METHOD OF MANUFACTURING SEMICONDUCTOR DEVICE AND PLASMA GENERATING APPARATUS

CROSS REFERENCE TO RELATED APPLICATIONS

This application is a continuation application of PCT International Application No. PCT/JP2020/012890, filed on Mar. 24, 2020, the entire contents of which are hereby incorporated by reference.

TECHNICAL FIELD

The present disclosure relates to a substrate processing apparatus, a method of manufacturing a semiconductor device and a plasma generating apparatus.

BACKGROUND

A circuit pattern of a semiconductor device such as a large scale integrated circuit, a DRAM (dynamic random access memory) and a flash memory is miniaturized as the semiconductor device is highly integrated. According to some related arts, in a manufacturing process of the semiconductor device, a process using a plasma may be performed as a process for realizing a miniaturization of the circuit pattern.

In the manufacturing process of the semiconductor device, a substrate processing may be performed by supplying a predetermined gas to a semiconductor substrate (hereinafter, also simply referred to as a "substrate"). In the substrate processing, it is preferable that a surface of the substrate is uniformly processed. However, as the circuit pattern is miniaturized, an activated gas may not be uniformly supplied onto the surface of the substrate due to an increase in a surface area of the substrate. In such a case, it may be difficult to form a uniform film on the surface of the substrate.

SUMMARY

According to the present disclosure, there is provided a technique capable of forming a uniform film on a surface of a substrate.

According to one aspect of the technique of the present disclosure, there is provided a substrate processing apparatus including: a process chamber in which a substrate is processed; a gas supplier through which a process gas is supplied to the process chamber; a plasma generator provided so as to protrude into the process chamber, constituted by a coil and an insulator, and configured to generate a plasma of the process gas in the process chamber; and an adjuster capable of adjusting a gap distance between the coil and the insulator.

DETAILED DESCRIPTION

Embodiments of Present Disclosure

Hereinafter, one or more embodiments (hereinafter, also simply referred to as "embodiments") according to the technique of the present disclosure will be described with reference to the drawings.

First Embodiment

Hereinafter, a first embodiment according to the technique of the present disclosure will be described with reference to the drawings.

(1) Configuration of Substrate Processing Apparatus

Figure 1:
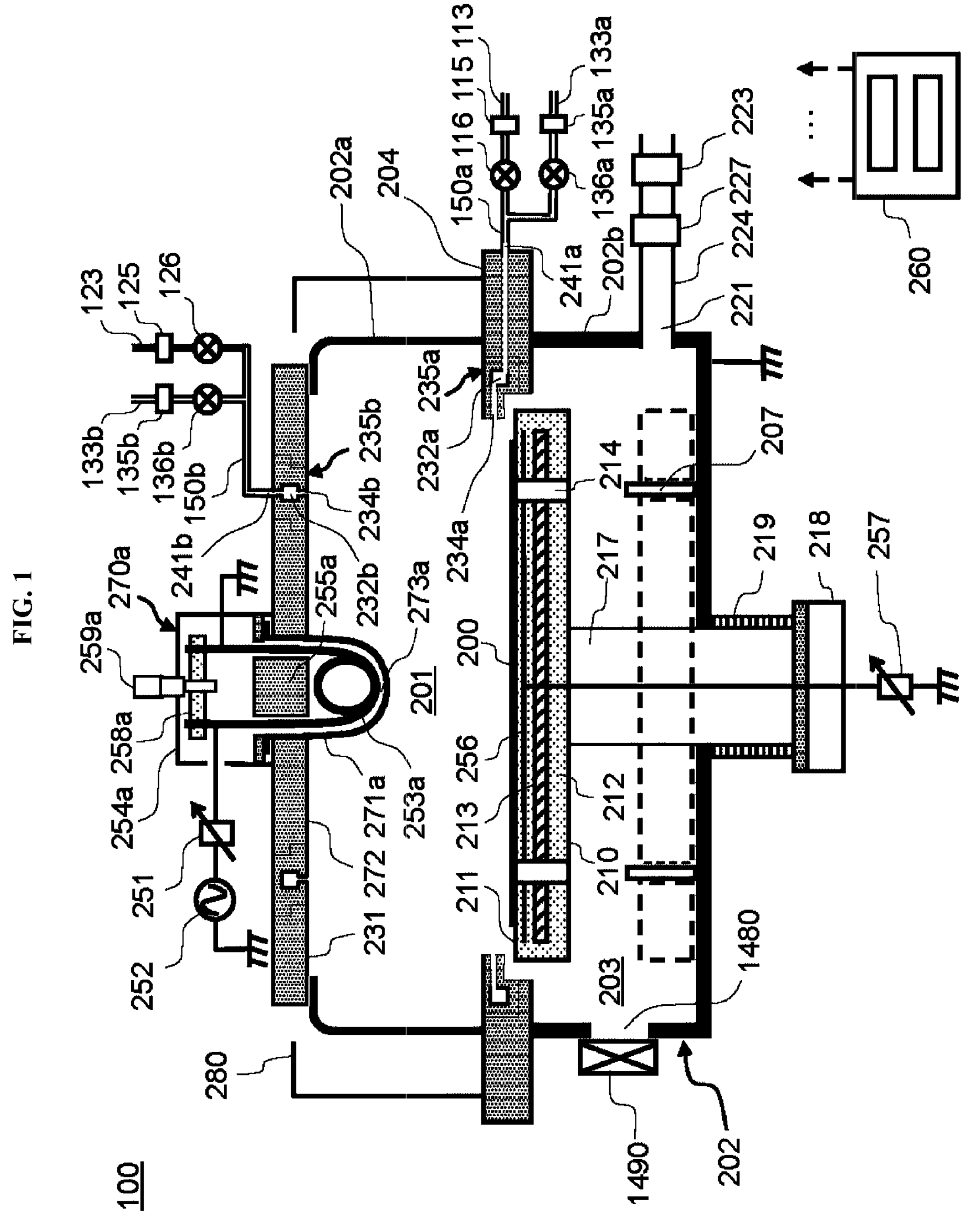
FIG. 1 is a diagram schematically illustrating a substrate processing apparatus according to a first embodiment of the present disclosure.

First, a configuration of a substrate processing apparatus 100 according to the first embodiment of the present disclosure will be described. For example, the substrate processing apparatus 100 is configured as an insulating film forming apparatus. As shown in FIG. 1, the substrate processing apparatus 100 may be configured as a single wafer type substrate processing apparatus.

<Process Vessel>

As shown in FIG. 1, the substrate processing apparatus 100 includes a process vessel 202. For example, the process vessel 202 is configured as a flat and sealed vessel whose horizontal cross-section is of a circular shape. For example, the process vessel 202 is made of a metal such as aluminum (Al) and stainless steel (SUS) or made of an insulating material such as quartz and alumina. A process chamber 201 in which a wafer (which is a substrate) 200 such as a silicon wafer is processed and a transfer chamber 203 located below the process chamber 201 are provided in the process vessel 202. The process vessel 202 is constituted mainly by a lid 231, an upper vessel 202*a*, a lower vessel 202*b* and a partition plate 204 provided between the upper vessel 202*a* and the lower vessel 202*b*. Further, a space surrounded by the lid 231, the upper vessel 202*a*, the partition plate 204, a second gas distributor (which is a second gas distribution structure or a second gas dispersion structure) 235*b* described later and a plasma generator (also referred to as a "plasma unit" or a "plasma generating structure") 270*a* to be described later may also be referred to as the "process chamber 201", and a space surrounded by the lower vessel 202*b* may also be referred to as the "transfer chamber 203".

A shield plate 280 is provided outside the process vessel 202 to shield a radiant heat from a heater 213 described later or an electromagnetic wave radiated from a coil 253*a* described later. The shield plate 280 is of a cylindrical shape, and is grounded.

A substrate loading/unloading port 1480 is provided adjacent to a gate valve 1490 at a side surface of the lower vessel 202*b*. The wafer 200 is transferred between the transfer chamber 203 and a vacuum transfer chamber (not shown) through the substrate loading/unloading port 1480. A plurality of lift pins 207 are provided at a bottom of the lower vessel 202*b*. In addition, the lower vessel 202*b* is electrically grounded.

A substrate support (which is a substrate supporting structure) 210 configured to support the wafer 200 is provided in the process chamber 201. The substrate support 210 mainly includes: a substrate mounting table 212 provided with a substrate placing surface 211 on which the wafer 200 is placed; the heater 213 serving as a heating structure embedded in the substrate mounting table 212; and a susceptor electrode 256 embedded in the substrate mounting table 212 similar to the heater 213. A plurality of through-holes 214 through which the lift pins 207 penetrate are provided at positions of the substrate mounting table 212 in a manner corresponding to the lift pins 207, respectively.

A bias regulator (which is a bias adjusting structure) 257 is connected to the susceptor electrode 256 such that an electric potential of the susceptor electrode 256 is capable of being adjusted. The bias regulator 257 is configured to adjust the electric potential of the susceptor electrode 256 by a controller 260 described later.

The substrate mounting table 212 is supported by a shaft 217. The shaft 217 penetrates the bottom of the lower vessel 202*b*, and is connected to an elevator 218 serving as an elevating structure outside the lower vessel 202*b*. The wafer 200 placed on the substrate placing surface 211 of the substrate mounting table 212 may be elevated or lowered by operating the elevator 218 by elevating or lowering the shaft 217 and the substrate mounting table 212. A bellows 219 covers a periphery of a lower end of the shaft 217 to maintain the process chamber 201 airtight. When the wafer 200 is transferred, the substrate mounting table 212 is lowered to a wafer transfer position indicated by a dashed line in FIG. 1. When the wafer 200 is processed, the substrate mounting table 212 is elevated to a processing position (which is a wafer processing position) shown in FIG. 1. Specifically, when the substrate mounting table 212 is lowered to the wafer transfer position, upper ends of the lift pins 207 protrude from an upper surface of the substrate placing surface 211 through the through-holes 214, and the lift pins 207 support the wafer 200 from thereunder. When the substrate mounting table 212 is elevated to the wafer processing position, the lift pins 207 are buried from the upper surface of the substrate placing surface 211, and the substrate placing surface 211 supports the wafer 200 from thereunder. Further, since the lift pins 207 are in direct contact with the wafer 200, the lift pins 207 are preferably made of a material such as quartz, alumina and silicon carbide.

<Exhauster>

An exhaust port 221 is provided on the side surface of the lower vessel 202*b*. An inner atmosphere of the process chamber 201 and an inner atmosphere of the transfer chamber 203 are exhausted through the exhaust port 221. An exhaust pipe 224 is connected to the exhaust port 221. A pressure regulator (which is a pressure adjusting structure) 227 such as an APC (Automatic Pressure Controller) valve and a vacuum pump 223 are sequentially connected to the exhaust pipe 224 in this order. The pressure regulator 227 adjusts an inner pressure of the process chamber 201 to a predetermined pressure. An exhauster (which is an exhaust structure or an exhaust system) is constituted mainly by the exhaust port 221, the exhaust pipe 224 and the pressure regulator 227. The exhauster may further include the vacuum pump 223.

<Gas Introduction Port>

A first gas introduction port 241*a* through which various gases are supplied into the process chamber 201 is provided at a side portion of the partition plate 204. In addition, a second gas introduction port 241*b* through which various gases are supplied into the process chamber 201 is provided at an upper portion of the process chamber 201. The first gas introduction port 241*a* serves as a first gas supply port, and the second gas introduction port 241*b* serves as a second gas supply port.

<Gas Supplier>

A first gas supply pipe 150*a* is connected to the first gas introduction port 241*a*. A first process gas supply pipe 113 and a purge gas supply pipe 133*a* are connected to the first gas supply pipe 150*a* such that a first process gas described later and a purge gas can be supplied through the first process gas supply pipe 113, the purge gas supply pipe 133*a* and the first gas supply pipe 150*a*. A second gas supply pipe 150*b* is connected to the second gas introduction port 241*b*. A second process gas supply pipe 123 and a purge gas supply pipe 133*b* are connected to the second gas supply pipe 150*b* such that a second process gas described later and the purge gas can be supplied through the second process gas supply pipe 123, the purge gas supply pipe 133*b* and the second gas supply pipe 150*b*.

<First Process Gas Supplier>

A mass flow controller (also simply referred to as an "MFC") 115 and a valve 116 are provided at the first process gas supply pipe 113. A first process gas supplier (which is a first process gas supply structure or a first process gas supply system) is constituted by the first process gas supply pipe 113, the MFC 115 and the valve 116. Further, the first process gas supplier may further include a first process gas supply source (not shown). In addition, when a source material of the first process gas is in a liquid state or a solid state, a vaporizer (not shown) may be provided. That is, the first process gas supplier may further include the vaporizer.

<Second Process Gas Supplier>

An MFC 125 and a valve 126 are provided at the second process gas supply pipe 123. A second process gas supplier (which is a second process gas supply structure or a second process gas supply system) is constituted by the second process gas supply pipe 123, the MFC 125 and the valve 126. Further, the second process gas supplier may further include a second process gas supply source (not shown).

<Purge Gas Supplier>

An MFC 135*a* and a valve 136*a* are provided at the purge gas supply pipe 133*a*. A first purge gas supplier (which is a first purge gas supply structure or a first purge gas supply system) is constituted by the purge gas supply pipe 133*a*, the MFC 135*a* and the valve 136*a*. In addition, an MFC 135*b* and a valve 136*b* are provided at the purge gas supply pipe 133*b*. A second purge gas supplier (which is a second purge gas supply structure or a second purge gas supply system) is constituted by the purge gas supply pipe 133*b*, the MFC 135*b* and the valve 136*b*. That is, as a purge gas supplier (which is a purge gas supply structure or a purge gas supply system), the first purge gas supplier constituted by the purge gas supply pipe 133*a*, the MFC 135*a* and the valve 136*a* and the second purge gas supplier constituted by the purge gas supply pipe 133*b*, the MFC 135*b* and the valve 136*b* are provided. Further, the purge gas supplier may further include a purge gas supply source (not shown).

<Gas Distributor>

A first gas distributor (which is a first gas distribution structure or a first gas dispersion structure) 235*a* serving as a structure of distributing (or dispersing) a gas such as the first process gas is connected to the first gas introduction port 241*a*. The first gas distributor 235*a* is configured as a ring-shaped configuration constituted by a first buffer chamber 232*a* and a plurality of first dispersion holes 234*a*, and is arranged adjacent to the partition plate 204. The first process gas and the purge gas introduced through the first gas introduction port 241*a* are supplied to the first buffer chamber 232*a* of the first gas distributor 235*a*, and then supplied to the process chamber 201 through the plurality of first dispersion holes 234*a*. Similarly, the second gas distributor 235*b* serving as a structure of distributing (or dispersing) a gas such as the second process gas is connected to the second gas introduction port 241*b*. The second gas distributor 235*b* is configured as a ring-shaped configuration constituted by a second buffer chamber 232*b* and a plurality of second dispersion holes 234*b*, and is arranged between the lid 231 and the plasma generator 270*a* described later. The second process gas and the purge gas introduced through the second gas introduction port 241*b* are supplied to the second buffer chamber 232*b* of the second gas distributor 235*b*, and then supplied to the process chamber 201 through the plurality of second dispersion holes 234*b*.

<Plasma Generator>

The plasma generator 270*a* serving as the plasma generating structure partially protruding into the process chamber 201 is arranged above the upper vessel 202*a*. For example, the plasma generator 270*a* is constituted by: an insulator 271*a* fixed to a pedestal 272; the coil 253*a* arranged in the vicinity of the insulator 271*a*; a first electromagnetic wave shield 254*a* and a second electromagnetic wave shield 255*a* arranged above the coil 253*a* to cover the coil 253*a*; a reinforcing structure (or a fixing structure) 258*a* reinforced by fixing both ends of the coil 253*a* with an insulating material such as a resin; and a micrometer 259*a* (which is a moving structure or a mover capable of vertically moving the coil 253*a*) including a shaft fixed to the first electromagnetic wave shield 254*a* and moving vertically while rotating.

For example, the insulator 271*a* is made of an insulating material such as quartz and alumina, and is provided at the upper portion of the process chamber 201 so as to protrude toward an inner space of the process chamber 201. A portion of the insulator 271*a* (that is, a lower portion of the insulator 271*a*) arranged to protrude toward the inner space of the process chamber 201 is provided with a curved surface constituting a hemispherical shape or a semi-spheroid shape. Further, an inner atmosphere and an outer atmosphere of the insulator 271*a* are isolated from each other by a vacuum seal. In addition, a diameter of the insulator 271*a* is set to be smaller than a diameter of the process chamber 201. Preferably, the diameter of the insulator 271*a* is set to be smaller than a diameter of the substrate mounting table 212.

For example, the coil 253*a* is configured as a conductive metal pipe, and includes a spiral-shaped portion extending in a horizontal direction (in a depth direction in FIG. 1). For example, the spiral-shaped portion is configured as a circular shape with 1.5 winding turns (that is, the conductive metal pipe constituting the coil 253*a* is wound 1.5 times in a circular shape so as to form the spiral-shaped portion), and a side portion and a bottom portion of the spiral-shaped portion are located along the curved surface of the insulator 271*a*. That is, the coil 253*a* is shaped such that a contour and a curvature of a curved surface of the coil 253*a* approximately fit into the curved surface of the insulator 271*a*.

Figures 2A, 2B, 2C, 2D, 2E, 2F, 2G, 2H, 2I, 2J:
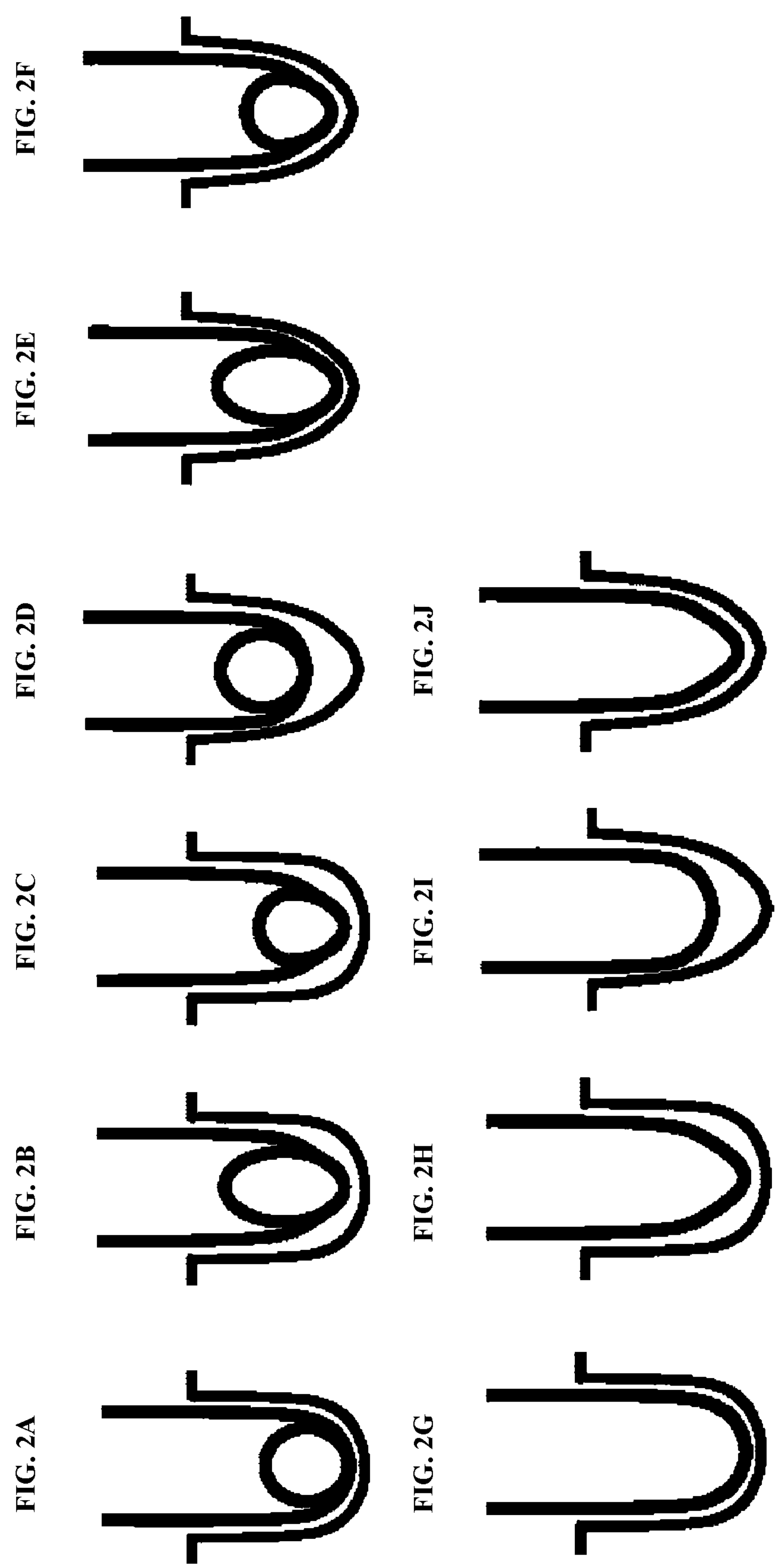
FIGS. 2A to 2J are diagrams each of which schematically illustrates a combination of an insulator and a coil of the substrate processing apparatus according to the first embodiment of the present disclosure.

The coil 253*a* is not limited to the configuration described above including the spiral-shaped portion with 1.5 winding turns. For example, the coil 253*a* may include a spiral-shaped portion with 0.5 winding turn, 2.5 winding turns or 3.5 winding turns. Alternatively, the coil 253*a* may include a spiral-shaped portion configured as an elliptical spiral shape or a shape in which a circular shape and an elliptical shape are combined. Further, the lower portion of the insulator 271*a* is not limited to the configuration of the hemispherical shape described above. For example, the lower portion of the insulator 271*a* may be of a semi-spheroid shape. Exemplary combinations of the coil 253*a* and the insulator 271*a* are shown in FIGS. 2A through 2J. In FIG. 2A, a combination of the coil 253*a* of the circular shape with 1.5 winding turns and the insulator 271*a* of the hemispherical shape is illustrated. In FIG. 2B, a combination of the coil 253*a* of the elliptical shape with 1.5 winding turns and the insulator 271*a* of the hemispherical shape is illustrated. In FIG. 2C, a combination of the coil 253*a* including the elliptical shape with 1.0 winding turn and the circular shape with 0.5 winding turn and the insulator 271*a* of the hemispherical shape is illustrated. In FIG. 2D, a combination of the coil 253*a* of the circular shape with 1.5 winding turns and the insulator 271*a* of the semi-spheroid shape is illustrated. In FIG. 2E, a combination of the coil 253*a* of the elliptical shape with 1.5 winding turns and the insulator 271*a* of the semi-spheroid shape is illustrated. In FIG. 2F, a combination of the coil 253*a* including the elliptical shape with 1.0 winding turn and the circular shape with 0.5 winding turn and the insulator 271*a* of the semi-spheroid shape is illustrated. In FIG. 2G, a combination of the coil 253*a* of the circular shape with 0.5 winding turn and the insulator 271*a* of the hemispherical shape is illustrated. In FIG. 2H, a combination of the coil 253*a* of the elliptical shape with 0.5 winding turn and the insulator 271*a* of the hemispherical shape is illustrated. In FIG. 2I, a combination of the coil 253*a* of the circular shape with 0.5 winding turn and the insulator 271*a* of the semi-spheroid shape is illustrated. In FIG. 2J, a combination of the coil 253*a* of the elliptical shape with 0.5 winding turn and the insulator 271*a* of the semi-spheroid shape is illustrated. That is, the coil 253*a* may include the spiral-shaped portion of at least 0.5 winding turn. Further, each coil shown in FIGS. 2G through 2J are a simply U-shaped coil.

A first end (one end) of the coil 253*a* is connected to a matcher (which is a matching structure) 251 and a high frequency power supply 252, and a second end (the other end) of the coil 253*a* is connected to a ground. The first electromagnetic wave shield 254*a* and the second electromagnetic wave shield 255*a* are also connected to the ground. A high frequency power from the high frequency power supply 252 is supplied (or applied) between the first end of the coil 253*a* connected to the matcher 251 and the ground to which the second end of the coil 253*a*, the first electromagnetic wave shield 254*a* and the second electromagnetic wave shield 255*a* are connected.

Each of the first electromagnetic wave shield 254*a* and the second electromagnetic wave shield 255*a* is configured as a conductive metal plate, and of a cylindrical shape or of a rectangular parallelepiped shape. That is, by including the first electromagnetic wave shield 254*a* and the second electromagnetic wave shield 255*a*, the plasma generator 270*a* is shielded by the conductive metal plate of the cylindrical shape or of the rectangular parallelepiped shape.

According to the plasma generator 270*a* configured as described above, when a process gas (in particular, a reactive gas described later serving as the second process gas) is supplied to the process chamber 201, the process gas is induced by an alternating magnetic field created by the coil 253*a*, and thereby, an inductively coupled plasma (abbreviated as "ICP") is generated. That is, the plasma generator 270*a* is configured to generate a plasma of the process gas within the process chamber 201. For generating the plasma, the plasma generator 270*a* is provided so as to partially protrude into the process chamber 201. Therefore, a ratio (or a region) of the plasma that couples (or intersects) with an electromagnetic field emitted from the coil 253*a* increases, and an efficiency (also referred to as an "input efficiency") of inputting the high frequency power of the plasma also increases. As a result, it is possible to improve an efficiency (also referred to as a "plasma generation efficiency") of generating the plasma by the plasma generator 270*a*.

In addition, when the coil 253*a* of the plasma generator 270*a* is supplied with the high frequency power from the high frequency power supply 252, a resistance value gradually increases due to a generation of Joule heat. As a result, the matcher 251 attempting to perform an impedance matching may become unstable. Therefore, in order to stabilize a temperature of a component such as the coil 253*a*, the high frequency power supply 252 and the matcher 251, the coils 253*a* may be cooled with a substance such as water and air such that the resistance value can be maintained constant.

<Adjusting Structure (Adjuster)>

The shaft of the micrometer 259*a* of the plasma generator 270*a* is fixed to the reinforcing structure (or the fixing structure) 258*a* via a bearing (not shown). Further, by rotating the micrometer 259*a*, the reinforcing structure 258*a* and the coil 253*a* are moved together in the vertical direction. Thereby, it is possible to adjust a gap distance 273*a* between the coil 253*a* and the insulator 271*a*. More specifically, it is possible to increase the gap distance 273*a* by moving the coil 253*a* away from the insulator 271*a* by rotating the micrometer 259*a*, or it is also possible to decrease the gap distance 273*a* by moving the coil 253*a* closer to the insulator 271*a* by rotating the micrometer 259*a*. That is, the micrometer 259*a* and the reinforcing structure 258*a* are configured to function as a gap adjusting structure (hereinafter, also simply referred to as an "adjusting structure" or an "adjuster") capable of adjusting the gap distance 273*a* between the coil 253*a* and the insulator 271*a*. Further, as long as the gap distance 273*a* between the coil 253*a* and the insulator 271*a* is capable of being adjusted, another configuration may be used as the adjusting structure (adjuster) instead of the above-described configuration including the micrometer 259*a* and the reinforcing structure 258*a*. A plasma generating apparatus according to the present embodiment is constituted by the plasma generator (which is the plasma generating structure) 270*a* and the adjusting structure described above. In the present embodiment, the gap distance 273*a* may refer to a distance at least between a front end (tip) of the coil 253*a* and a front end (tip) of the insulator 271*a*. Further, the gap distance 273*a* between the coil 253*a* and the insulator 271*a* may be adjusted at least one of timings before, during or after a film-forming process described later.

The plasma generation efficiency of the plasma generator 270*a* improves as a surface area of the coil 253*a* facing the insulator 271*a* increases. Furthermore, when the curved surface of the insulator 271*a* is of the hemispherical shape or of the semi-spheroid shape described above and the curved surface of the coil 253*a* has the contour and the curvature that approximately fit into the curved surface of the insulator 271*a*, it is possible to further improve the plasma generation efficiency. In such a case, depending on the gap distance 273*a* between the coil 253*a* and the insulator 271*a*, it is also possible to vary (or change) the plasma generation efficiency of the plasma generator 270*a*.

Figure 3:
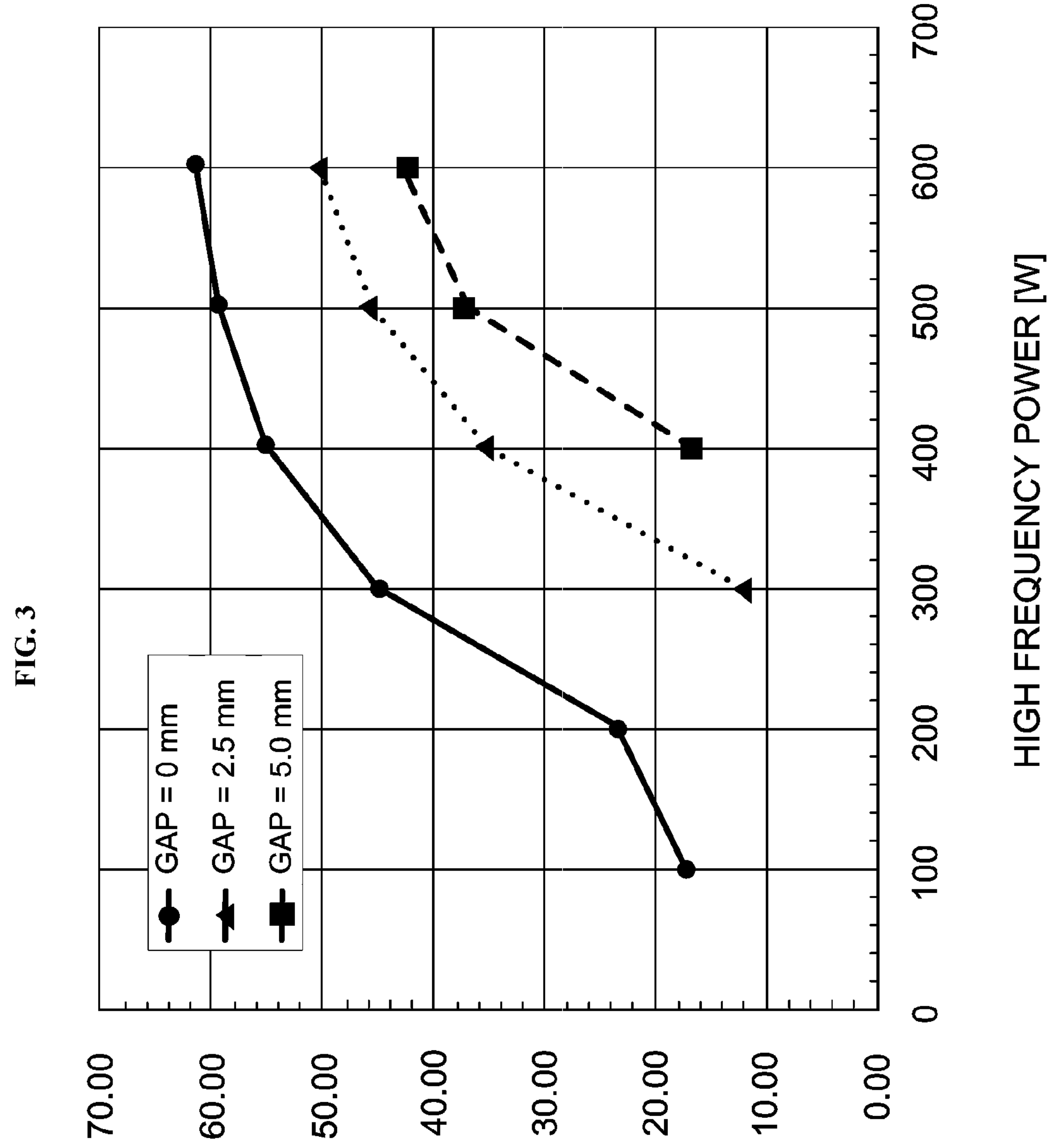
FIG. 3 is a graph schematically illustrating input efficiency characteristics of a high frequency power in the substrate processing apparatus according to the first embodiment of the present disclosure.

FIG. 3 is a graph schematically illustrating input efficiency characteristics of the high frequency power. Referring to FIG. 3, when the gap distance 273*a* is from 0 mm to 5 mm (specifically, when the "GAP" shown in FIG. 3 serving as the gap distance 273*a* is set to 0 mm, 2.5 mm, and 5 mm), it can be seen that a difference in the input efficiency is great even when the same high frequency power is supplied. For example, the shorter the gap distance 273*a* (that is, the closer the gap distance 273*a* is to 0 mm), the higher the input efficiency of the high frequency power, and a maximum input efficiency is obtained when the gap distance 273*a* is 0 mm. When the input efficiency of the high frequency power is improved, it is possible to provide the plasma with a high density. On the other hand, when the input efficiency of the high frequency power is lowered, it is possible to provide the plasma with a low density.

Therefore, by adjusting the gap distance 273*a* between the coil 253*a* and the insulator 271*a* by using the micrometer 259*a* (that is, the adjusting structure described above), it is possible to adjust the plasma generation efficiency of the plasma generator 270*a*. Thereby, it is also possible to control characteristics such as a density and a diffusion of the plasma. That is, the micrometer 259*a* and the reinforcing structure 258*a* serving as the adjusting structure are configured to be capable of adjusting the gap distance 273*a* between the coil 253*a* and the insulator 271*a* in order to control a distribution of the plasma.

<Controller>

As shown in FIG. 1, the substrate processing apparatus 100 includes the controller 260 configured to be capable of controlling the components constituting the substrate processing apparatus 100.

Figure 4:
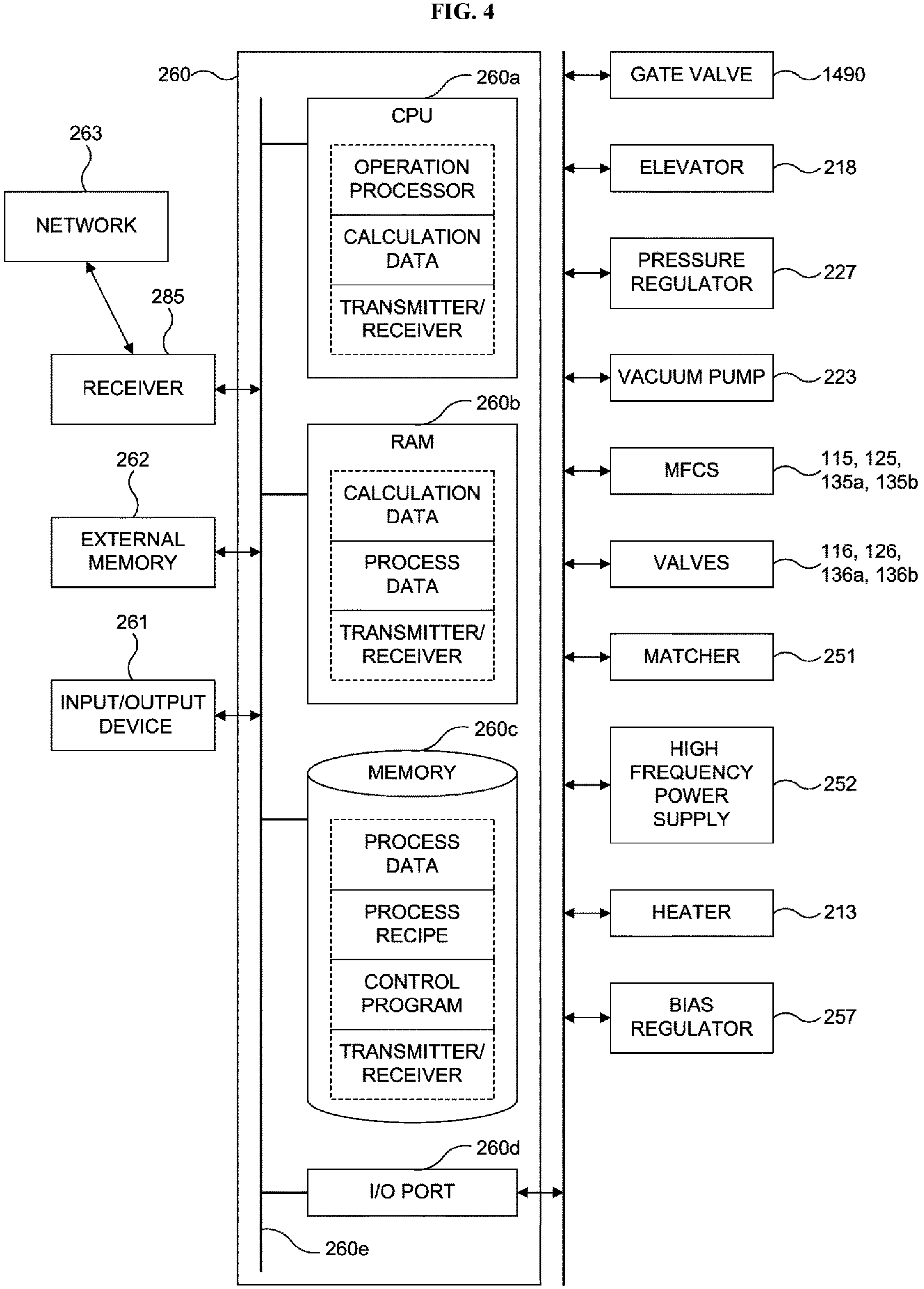
FIG. 4 is a block diagram schematically illustrating a configuration of a controller and related components of the substrate processing apparatus according to the first embodiment of the present disclosure.

The controller 260 is schematically illustrated in FIG. 4. The controller 260 serving as a control apparatus (or a control structure) is constituted by a computer including a CPU (Central Processing Unit) 260*a*, a RAM (Random Access Memory) 260*b*, a memory 260*c* and an I/O port 260*d*. The RAM 260*b*, the memory 260*c* and the I/O port 260*d* may exchange data with the CPU 260*a* through an internal bus 260*e*. For example, an input/output device 261 constituted by a component such as a touch panel, an external memory 262 and a receiver 285 may be connected to the controller 260.

The memory 260*c* is configured by a component such as a flash memory and a hard disk drive (HDD). For example, a control program configured to control operations of the substrate processing apparatus 100; a process recipe containing information on process sequences and process conditions of a substrate processing described later; and calculation data and process data generated in a process of setting the process recipe used for processing the wafer 200 may be readably stored in the memory 260*c*. Further, the process recipe is obtained by combining steps of the substrate processing described later such that the controller 260 can execute the steps to acquire a predetermined result, and functions as a program. Hereafter, the process recipe and the control program may be collectively or individually referred to as a "program". Thus, in the present specification, the term "program" may refer to the process recipe alone, may refer to the control program alone, or may refer to both of the process recipe and the control program. In addition, the RAM 260*b* functions as a memory area (work area) where a program or data such as the calculation data and the process data read by the CPU 260*a* is temporarily stored.

The I/O port 260*d* is electrically connected to the components such as the gate valve 1490, the elevator 218, the heater 213, the pressure regulator 227, the vacuum pump 223, the matcher 251, the high frequency power supply 252, the MFCs 115, 125, 135*a* and 135*b*, the valves 116, 126, 136*a* and 136*b* and the bias regulator 257.

The CPU 260*a* serving as an operation processor is configured to read and execute the control program from the memory 260*c* and to read the process recipe from the memory 260*c* in accordance with an instruction such as an operation command inputted from the input/output device 261. Further, the CPU 260*a* is configured to be capable of computing the calculation data by comparing a setting value inputted from the receiver 285 with the process recipe or control data stored in the memory device 260*c*. In addition, the CPU 260*a* may select process data (or the process recipe) based on the calculation data. The CPU 260*a* is configured to be capable of controlling various operations in accordance with the process recipe read from the memory 260*c*. For example, the CPU 260*a* is configured to be capable of controlling various operations such as an opening and closing operation of the gate valve 1490, an elevating and lowering operation of the elevator 218, a power supply operation to the heater 213, a pressure adjusting operation of the pressure regulator 227, a turn-on and turn-off operation of the vacuum pump 223, flow rate adjusting operation of various gases by the MFCs 115, 125, 135*a* and 135*b*, turn-on and turn-off operations for various gases by the valves 116, 126, 136*a* and 136*b*, a power matching control operation of the matcher 251, a power control operation of the high frequency power supply 252 and an electric potential control operation at the susceptor electrode 256 by the bias regulator 257.

The controller 260 is not limited to a dedicated computer, and the controller 260 may be embodied by a general-purpose computer. For example, the controller 260 according to the present embodiment may be embodied by preparing the external memory 262 (for example, a magnetic tape, a magnetic disk such as a flexible disk and a hard disk, an optical disk such as a CD and a DVD, a magneto-optical disk such as an MO, a semiconductor memory such as a USB memory and a memory card) in which the program described above is stored, and by installing the program onto the general-purpose computer using the external memory 262. Further, a method of providing the program to the computer is not limited to a case using the external memory 262. For example, the program may be directly provided to the computer by a communication structure such as the receiver 285 and a network 263 (for example, the Internet or a dedicated line) instead of the external memory 262. The memory 260*c* and the external memory 262 may be embodied by a non-transitory computer-readable recording medium. Hereinafter, the memory 260*c* and the external memory 262 may be collectively or individually referred to as a "recording medium". Thus, in the present specification, the term "recording medium" may refer to the memory 260*c* alone, may refer to the external memory 262 alone, or may refer to both of the memory 260*c* and the external memory 262.

(2) Substrate Processing

Figure 5:
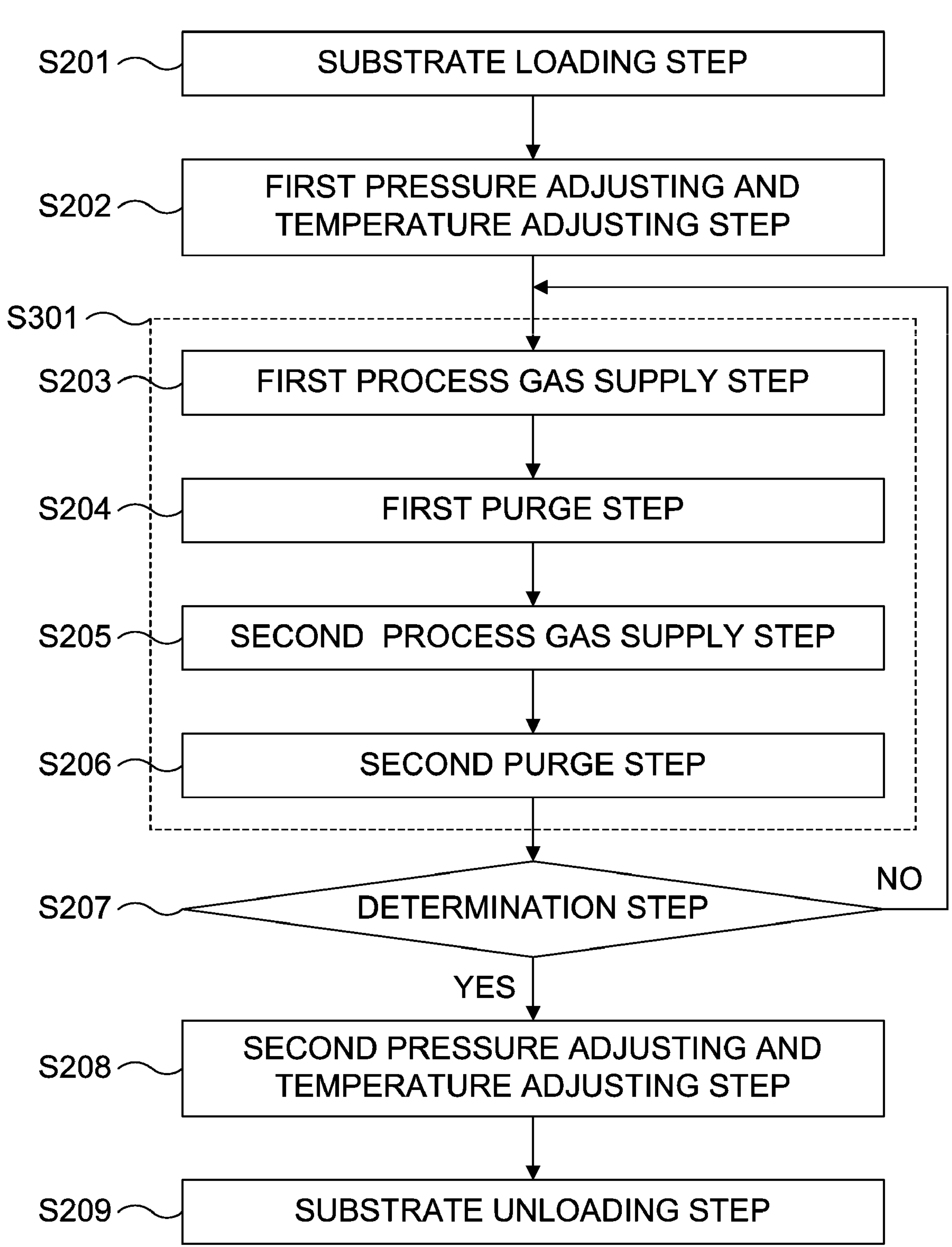
FIG. 5 is a flow chart schematically illustrating a substrate processing according to the first embodiment of the present disclosure.

Subsequently, as a part of a process of manufacturing a semiconductor device, the substrate processing (for example, the film-forming process) of forming a film on the substrate (that is, the wafer 200) by using the substrate processing apparatus 100 described above will be described with reference to FIGS. 5 and 6. The substrate processing will be described by way of an example in which a silicon nitride film (also referred to as an "SiN film") serving as a nitride film (which is an insulating film) is formed on the wafer 200. In the following description, the controller 260 controls the operations of the components constituting the substrate processing apparatus 100.

In the present specification, the term "wafer" may refer to "a wafer itself", or may refer to "a wafer and a stacked structure (aggregated structure) of a predetermined layer (or layers) or a film (or films) formed on a surface of the wafer". In the present specification, the term "a surface of a wafer" may refer to "a surface of a wafer itself", or may refer to "a surface of a predetermined layer (or a predetermined film) formed on a wafer". Thus, in the present specification, "forming a predetermined layer (or a film) on a wafer" may refer to "forming a predetermined layer (or a film) on a surface of a wafer itself", or may refer to "forming a predetermined layer (or a film) on a surface of another layer (or another film) formed on a wafer". In the present specification, the terms "substrate" and "wafer" may be used as substantially the same meaning.

An exemplary sequence of the substrate processing of performing the film-forming process on the substrate (that is, the wafer 200) will be described below.

<Substrate Loading Step S201>

First, in order to perform the film-forming process, the wafer 200 is transferred (or loaded) into the process chamber 201. Specifically, the substrate support 210 is lowered by the elevator 218 such that the lift pins 207 protrude from an upper surface of the substrate support 210 through the through-holes 214. After an inner pressure of the process chamber 201 and an inner pressure of the transfer chamber 203 are adjusted to a predetermined pressure, the gate valve 1490 is opened. Then, the wafer 200 is placed on the lift pins 207 through the substrate loading/unloading port 1480 by using a transfer device (not shown) such as tweezers. After the wafer 200 is placed on the lift pins 207, the gate valve 1490 is closed. Then, the substrate support 210 is elevated to a predetermined position by the elevator 218 such that the wafer 200 is placed on the substrate support 210 from the lift pins 207.

<First Pressure Adjusting and Temperature Adjusting Step S202>

Subsequently, by opening the valves 136*a* and 136*b*, the purge gas such as N2 gas whose flow rate is adjusted to a predetermined flow rate by each of the MFCs 135*a* and 135*b* is supplied into the process chamber 201, and the inner atmosphere of the process chamber 201 is exhausted through the exhaust port 221 such that the inner pressure of the process chamber 201 reaches and is maintained at a predetermined pressure. In the present step, an opening degree of a valve of the pressure regulator 227 is feedback-controlled based on a pressure value measured by a pressure sensor (not shown). Further, the power applied to the heater 213 is feedback-controlled based on a temperature value detected by a temperature sensor (not shown) such that an inner temperature of the process chamber 201 reaches and is maintained at a predetermined temperature. Specifically, the substrate support 210 is heated in advance by the heater 213. Then, after a temperature of the wafer 200 or the substrate support 210 becomes stable, the substrate support 210 is left in that state for a while. When a gas desorbed from components of the process chamber 201 or moisture is present in the process chamber 201, the gas or the moisture may be effectively removed by purging (or exhausting) the process chamber 201 with the N2 gas. Thereby, a preparing step before a film-forming step S301 is now completed. Before setting the inner pressure of the process chamber 201 to the predetermined pressure, the process chamber 201 may be vacuum-exhausted (or evacuated) for once to a vacuum level that can be reached by the vacuum pump 223. In the present step, a temperature of the heater 213 is adjusted from an idling temperature to a constant temperature within a range from 100° C. to 600° C., preferably 150° C. to 500° C., and more preferably 250° C. to 450° C. The voltage is applied to the susceptor electrode 256 by the bias regulator 257 such that an electric potential of the wafer 200 reaches and is maintained at a predetermined electric potential. In the present specification, a notation of a numerical range such as "from 100° C. to 600° C." means that a lower limit and an upper limit are included in the numerical range. Therefore, for example, the numerical range "from 100° C. to 600° C." means a range equal to or higher than 100° C. and equal to or lower than 600° C. The same also applies to other numerical ranges described herein.

<Film-forming Step S301>

After the wafer 200 is placed on the substrate support 210 and the inner atmosphere of the process chamber 201 is stabilized, the film forming step S301 is performed. In the present embodiment, the film forming step S301 will be described in detail with reference to FIGS. 5 and 6 by way of an example in which the SiN film is formed on the wafer 200. In the film-forming step S301, a first process gas supply step S203, a first purge step S204, a second process gas supply step S205, a second purge step S206 and a determination step S207 described below are performed.

<First Process Gas Supply Step S203>

In the first process gas supply step S203, dichlorosilane (SiH2Cl2, abbreviated as DCS) gas serving as the first process gas (which is a source gas) is supplied into the process chamber 201 through the first process gas supplier. Specifically, the valve 116 is opened, and a flow rate of the first process gas supplied from the first process gas supply source is adjusted by the MFC 115. The first process gas whose flow rate is adjusted is then supplied to the process chamber 201. The first process gas whose flow rate is adjusted passes through the first buffer chamber 232*a* of the first gas distributor 235*a*, and is supplied to the process chamber 201 in a depressurized state through the plurality of first dispersion holes 234*a*. Further, the exhauster continuously exhausts the process chamber 201 and the pressure regulator 227 is controlled such that the inner pressure of the process chamber 201 reaches and is maintained at a first pressure within a predetermined pressure range. With the inner pressure of the process chamber 201 is maintained at the first pressure within the predetermined pressure range, the first process gas is supplied into the process chamber 201 at the first pressure. For example, the first pressure may be set to a pressure within a range from 100 Pa to 10 kPa. By supplying the first process gas, a silicon-containing layer is formed on the wafer 200. According to the present embodiment, the silicon-containing layer refers to a layer containing silicon (Si) or a layer containing silicon and chlorine (Cl).

<First Purge Step S204>

In the first purge step S204, after the silicon-containing layer is formed on the wafer 200, the valve 116 of the first process gas supply pipe 113 is closed to stop a supply of the first process gas. By continuously exhausting the process chamber 201 by the exhauster (that is, the vacuum pump 223) and by stopping the supply of the first process gas, it is possible to remove (or exhaust) a residual gas in the process chamber 201 such as the first process gas present in the process chamber 201 and reaction by-products and the process gas remaining in the first buffer chamber 232*a* by using the vacuum pump 223. That is, the process chamber 201 is purged. In the first purge step S204, by opening the valve 136*a* of the first purge gas supplier and by supplying the N2 gas serving as the purge gas whose flow rate is adjusted by the MFC 135*a*, it is possible to push out the residual gas in the first buffer chamber 232*a*, and it is also possible to increase an efficiency of removing a residual gas on the wafer 200 such as the first process gas and the reaction by-products. In the first purge step S204, the second purge gas supplier may be used in combination with the first purge gas supplier, or a supply of the purge gas and a stop of the supply of the purge gas may be performed alternately.

After a predetermined time has elapsed, the valve 136*a* is closed to stop the supply of the purge gas. However, the purge gas may be continuously supplied by opening the valve 136*a*. By continuously supplying the purge gas to the first buffer chamber 232*a*, it is possible to prevent (or suppress) the process gas of another step from entering the first buffer chamber 232*a* in another step. In the first purge step S204, the flow rate of the purge gas supplied into the process chamber 201 or the first buffer chamber 232*a* may not be a large flow rate. For example, the process chamber 201 may be purged by supplying the purge gas of an amount substantially equal to a volume of the process chamber 201 such that a subsequent step (that is, the second process gas supply step S205) will not be adversely affected. By not completely purging the process chamber 201 as described above, it is possible to shorten a purge time for purging the process chamber 201, and it is also possible to improve a manufacturing throughput. In addition, it is possible to reduce a consumption of the purge gas to the minimum.

In the first purge step S204, a temperature of the heater 213 is set (adjusted) to substantially the same temperature as that of the heater 213 in the first process gas supply step S203 of supplying the first process gas to the wafer 200. For example, the flow rate of the purge gas supplied through the purge gas supplier (that is, the first purge gas supplier) is set to a flow rate within a range from 100 sccm to 10,000 sccm. A rare gas such as argon (Ar) gas, helium (He) gas, neon (Ne) gas and xenon (Xe) gas may be used as the purge gas instead of the N2 gas, or a combination thereof may be used as the purge gas.

<Second Process Gas Supply Step S205>

In the second process gas supply step S205, the valve 126 of the second process gas supplier is opened, and ammonia (NH3) gas serving as the second process gas (which is the reactive gas) is supplied into the process chamber 201 in a depressurized state through the second buffer chamber 232*b* and the plurality of second dispersion holes 234*b* of the second gas distributor 235*b*. In the second process gas supply step S205, the exhauster continuously exhausts the process chamber 201, a flow rate of the second process gas is adjusted by the MFC 125 to a predetermined flow rate (for example, within a range from 100 sccm to 5,000 sccm), and the pressure regulator 227 is controlled such that the inner pressure of the process chamber 201 reaches and is maintained at a second pressure (for example, within a predetermined pressure range from 1 Pa to 200 Pa).

Figure 6:
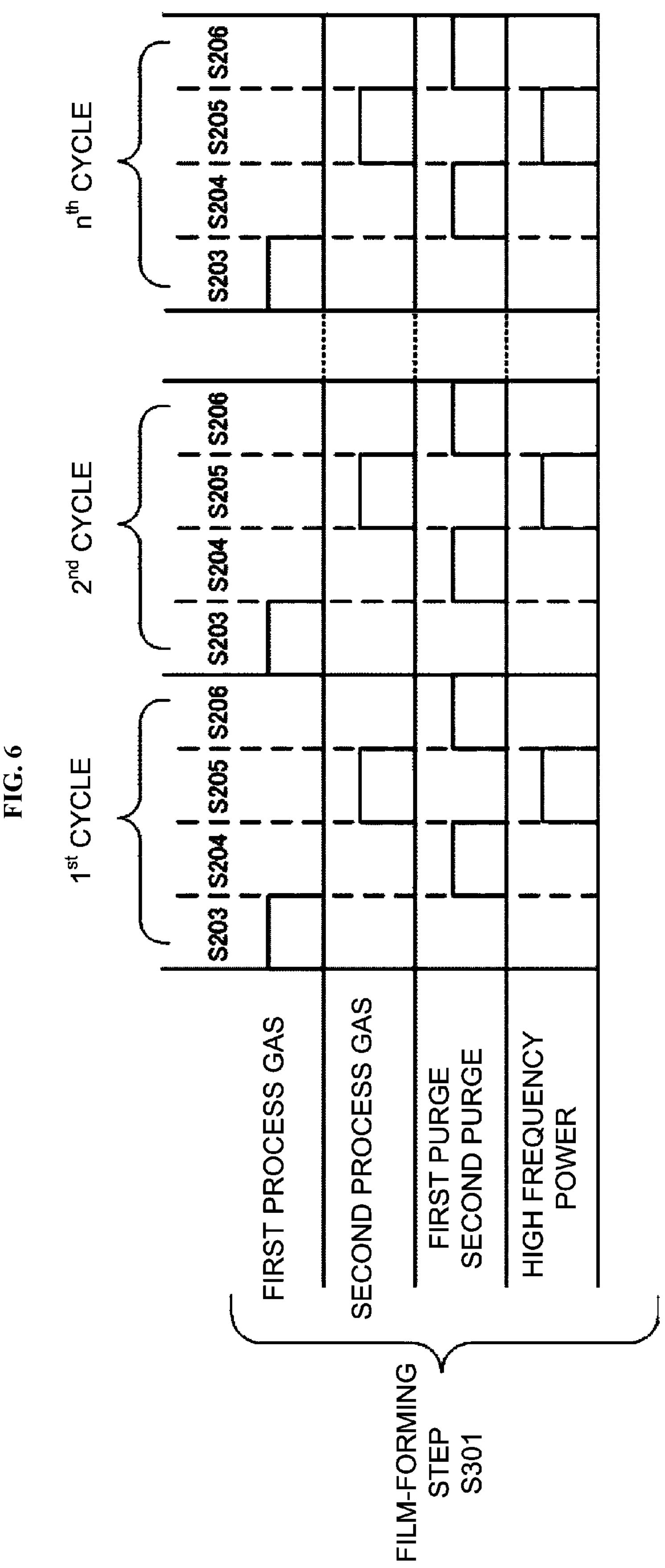
FIG. 6 is a diagram schematically illustrating an exemplary sequence of the substrate processing according to the first embodiment of the present disclosure.

Further, in the second process gas supply step S205, the high frequency power is supplied from the high frequency power supply 252 to the coil 253*a* of the plasma generator 270*a* through the matcher 251. In FIG. 6, a supply of the high frequency power is started simultaneously with a supply of the second process gas. However, the supply of the high frequency power may be started before the supply of the second process gas or the high frequency power may be continued to be supplied thereafter. By supplying the high frequency power, it is possible to generate the plasma of the second process gas on the wafer 200.

By converting the NH3 gas serving as the second process gas (that is, the reactive gas) into a plasma state, it is possible to generate an activated NH3 gas (that is, the plasma or radicals of the NH3 gas), and it is also possible to supply an active species of the activated NH3 gas to the silicon-containing layer on the wafer 200. The supplied active species of the NH3 gas reacts with the silicon-containing layer to form a silicon nitride layer (also referred to as an "SiN layer"). That is, by supplying the active species of the activated NH3 gas to the silicon-containing layer, it is possible to perform a nitridation process on the silicon-containing layer at a low temperature. Further, when the active species of the activated NH3 gas is supplied to the silicon-containing layer, it is also possible to perform a modification process on the silicon-containing layer such as a recovery of defects in a molecular bond and a desorption of impurities.

In the second process gas supply step S205, the gap distance 273*a* between the coil 253*a* and the insulator 271*a* is adjusted by the micrometer 259*a* such that the distribution of the plasma in the process chamber 201 is in a desired state. Specifically, for example, by rotating the micrometer 259*a*, the gap distance 273*a* between the coil 253*a* and the insulator 271*a* is adjusted to an optimum distance such that the distribution of the plasma in the process chamber 201 is uniform in the horizontal direction on the wafer 200. The optimum distance may be appropriately set in accordance with parameters such as an apparatus specification and various process conditions. That is, the optimum distance is not limited to a specific value.

When the gap distance 273*a* between the coil 253*a* and the insulator 271*a* is adjusted as described above, it is possible to uniformize the distribution of the plasma in the process chamber 201. Thereby, it is possible to uniformly supply the active species of the activated NH3 gas onto the surface of the wafer 200. Therefore, it is possible to uniformly form the SiN layer on the surface of the wafer 200.

Further, the distribution of the plasma in the process chamber 201 may also be affected by the high frequency power supplied to the coil 253*a*. Therefore, it is preferable that the high frequency power supplied to the coil 253*a* is also adjusted to an optimum value such that, for example, the distribution of the plasma in the process chamber 201 is uniform in the horizontal direction on the wafer 200, for example. According to the present embodiment, for example, the power supplied from the high frequency power supply 252 to the plasma generator 270*a* is set to a power within a range from 100 W to 1,000 W, preferably from 300 W to 600 W. When the power is less than 100 W, the plasma of a CCP (Capacitively Coupled Plasma) mode becomes dominant, so an amount of the active species generated by the plasma is extremely low. As a result, a rate (or a speed) of the substrate processing is greatly reduced. Further, when the power exceeds 600 W, the plasma begins to strongly sputter against an inner wall of a reaction chamber (that is, the process vessel 202) made of quartz, so a material such as silicon (Si) and oxygen (O) which is undesirable for a film on the wafer 200 (that is, a film other than a silicon oxide film) may be supplied.

In addition, a plasma process time is set to a time duration within a range from 60 seconds to 600 seconds, preferably from 120 seconds to 300 seconds. When the plasma process time is less than 60 seconds, it may not be possible to obtain a sufficient thickness of the film (that is, the SiN layer). On the other hand, the plasma process time exceeds 600 seconds, a uniformity of the film may be adversely affected on the surface of the substrate (that is, the wafer 200) or on stepped portions on the substrate. Further, the substrate may be damaged.

By adjusting the electric potential of the susceptor electrode 256 provided in the substrate mounting table 212 by the bias regulator 257, it is possible to control an amount of plasma charged particles supplied to the wafer 200. For example, when a step processing is performed on the surface of the wafer 200, by suppressing the amount of the plasma charged particles supplied to the wafer 200, it is possible to effectively improve a film coverage ratio of the film-forming process. Further, for example, by adjusting conditions such as the inner pressure of the process chamber 201, the flow rate of the second process gas by the MFC 125 and the temperature of the wafer 200 by the heater 213, depending on results of adjusting the conditions described above, it is possible to perform the nitridation process or the modification process with a predetermined distribution, a predetermined depth and a predetermined nitrogen composition ratio with respect to the silicon-containing layer.

After a predetermined time has elapsed from a start of the second process gas supply step S205, the valve 126 of the second process gas supplier is closed to stop the supply of the second process gas. In the second process gas supply step S205, the temperature of the heater 213 is set (adjusted) to substantially the same temperature as that of the heater 213 in the first process gas supply step S203 of supplying the first process gas to the wafer 200.

<Second Purge Step S206>

In the second purge step S206, after the SiN layer is formed on the wafer 200, the valve 126 of the second process gas supply pipe 123 is closed to stop the supply of the second process gas. By continuously exhausting the process chamber 201 by the exhauster (that is, the vacuum pump 223) and by stopping the supply of the second process gas, it is possible to remove (or exhaust) a residual gas in the process chamber 201 such as the second process gas present in the process chamber 201 and reaction by-products and the process gas remaining in the second buffer chamber 232*b* by using the vacuum pump 223. That is, the process chamber 201 is purged. In the second purge step S206, by opening the valve 136*b* of the second purge gas supplier and by supplying the N2 gas serving as the purge gas whose flow rate is adjusted by the MFC 135*b*, it is possible to push out the residual gas in the second buffer chamber 232*b*, and it is also possible to increase an efficiency of removing the residual gas on the wafer 200 such as the second process gas and the reaction by-products. In the second purge step S206, the first purge gas supplier may be used in combination with the second purge gas supplier, or the supply of the purge gas and the stop of the supply of the purge gas may be performed alternately.

After a predetermined time has elapsed, the valve 136*b* is closed to stop the supply of the purge gas. However, the purge gas may be continuously supplied by opening the valve 136*b*. By continuously supplying the purge gas to the second buffer chamber 232*b*, it is possible to prevent (or suppress) the process gas of another step from entering the second buffer chamber 232*b* in another step. In the second purge step S206, the flow rate of the purge gas supplied into the process chamber 201 or the second buffer chamber 232*b* may not be a large flow rate. For example, the process chamber 201 may be purged by supplying the purge gas of the amount substantially equal to the volume of the process chamber 201 such that a subsequent step (that is, the first process gas supply step S203) will not be adversely affected. By not completely purging the process chamber 201 as described above, it is possible to shorten the purge time for purging the process chamber 201, and it is also possible to improve the manufacturing throughput. In addition, it is possible to reduce the consumption of the purge gas to the minimum.

In the second purge step S206, the temperature of the heater 213 is set (adjusted) to substantially the same temperature as that of the heater 213 in the second process gas supply step S205 of supplying the second process gas to the wafer 200. For example, the flow rate of the purge gas supplied through the purge gas supplier (that is, the second purge gas supplier) is set to a flow rate within a range from 100 sccm to 10,000 sccm. The rare gas such as argon (Ar) gas, helium (He) gas, neon (Ne) gas and xenon (Xe) gas may be used as the purge gas instead of the N2 gas, or a combination thereof may be used as the purge gas.

<Determination Step S207>

After the second purge step S206 is completed, the controller 260 determines whether a cycle (of the film-forming step S301) including the step S203 through the step S206 is performed a predetermined number of times (n times). That is, the controller 260 determines whether a film (that is, the SiN film) of a desired thickness is formed on the wafer 200. It is possible to form the SiN film on the wafer 200 by performing the cycle including the step S203 through the step S206 at least once in the film-forming step S301. It is preferable that the cycle is performed a plurality of times until the SiN film of the desired thickness is formed on the wafer 200.

When the controller 260 determines, in the determination step S207, that the cycle is not performed the predetermined number of times ("NO" in FIG. 5), the cycle including the step S203 through the step S206 of the film-forming step S301 is repeatedly performed. When the controller 260 determines, in the determination step S207, that the cycle is performed the predetermined number of times ("YES" in FIG. 5), the film-forming step S301 is terminated.

<Second Pressure Adjusting and Temperature Adjusting Step S208>

After the film-forming step S301 is completed, by opening the valves 136*a* and 136*b*, the purge gas such as N2 gas whose flow rate is adjusted to a predetermined flow rate by each of the MFCs 135*a* and 135*b* is supplied into the process chamber 201, and the inner atmosphere of the process chamber 201 is exhausted through the exhaust port 221 such that the inner pressure of the process chamber 201 reaches and is maintained at a predetermined pressure. In the present step, the opening degree of the valve of the pressure regulator 227 is feedback-controlled based on a pressure value measured by the pressure sensor (not shown). Further, the power applied to the heater 213 is feedback-controlled based on a temperature value detected by the temperature sensor (not shown) such that the inner temperature of the process chamber 201 reaches and is maintained at a predetermined temperature. In the present step, for example, the inner pressure of the process chamber 201 may be set to substantially the same pressure as that of the process chamber 201 when the gate valve 1490 is opened in the first pressure adjusting and temperature adjusting step S202, and the temperature of the heater 213 may be set to substantially the same temperature as that of the heater 213 in an idling state (that is, the idling temperature described above). Alternatively, when a subsequent wafer is continuously processed under the same temperature conditions, the temperature of the heater 213 may be maintained.

<Substrate Unloading Step S209>

Subsequently, the substrate support 210 is lowered by the elevator 218 such that the lift pins 207 protrude from the upper surface of the substrate support 210 through the through-holes 214 and the wafer 200 is placed on the lift pins 207. The gate valve 1490 is opened, and the wafer 200 is transferred (or unloaded) out of the transfer chamber 203 through the substrate loading/unloading port 1480 using the transfer device (not shown) such as the tweezers. Then, the gate valve 1490 is closed.

By performing the substrate processing as described above, it is possible to obtain the wafer 200 with the SiN film of a predetermined thickness formed on the surface thereof.

(3) Effects According to Present Embodiment

According to the present embodiment, it is possible to obtain one or more of the following effects.

(a) According to the present embodiment, by adjusting the gap distance 273*a* between the coil 253*a* and the insulator 271*a*, it is possible to control the distribution of the plasma of the second process gas generated in the process chamber 201 by the plasma generator 270*a*. Therefore, by controlling the distribution of the plasma of the second process gas to uniformize the distribution of the plasma in the process chamber 201, it is possible to uniformly supply the active species of the second process gas onto the surface of the wafer 200. Thereby, it is possible to uniformly form the film such as the SiN film on the surface of the wafer 200.

(b) According to the present embodiment, the coil 253*a* includes the spiral-shaped portion of at least 0.5 winding turn, and the lower portion of the insulator 271*a* arranged to protrude toward the inner space of the process chamber 201 is of the hemispherical shape or of the semi-spheroid shape. Therefore, by securing the surface area of the coil 253*a* facing the insulator 271*a*, it is possible to improve the plasma generation efficiency. Further, by adjusting the gap distance 273*a*, it is possible to reliably control the distribution of plasma. That is, the present embodiment is very useful for controlling the distribution of plasma.

(c) According to the present embodiment, the coil 253*a* is shaped such that the contour and the curvature of the curved surface of the coil 253*a* approximately fit into the curved surface of the insulator 271*a*. With such a configuration, by securing the surface area of the coil 253*a* facing the insulator 271*a*, it is possible to further improve the plasma generation efficiency. Further, by adjusting the gap distance 273*a*, it is possible to more reliably control the distribution of plasma. That is, the present embodiment is very useful for controlling the distribution of plasma.

(d) According to the present embodiment, the plasma generator 270*a* is shielded by the conductive metal plate of the cylindrical shape or of the rectangular parallelepiped shape. Therefore, even when the high frequency power is supplied to the plasma generator 270*a* to generate the plasma, it is possible to suppress influences between an inner side and an outer side of the conductive metal plate.

(e) According to the present embodiment, by using the micrometer 259*a* serving as the adjusting structure, it is possible to fine-tune the gap distance 273*a* in units of micrometers. Thereby, it is possible to fine-tune the distribution of plasma.

(f) According to the present embodiment, it is possible to adjust a position of the coil 253*a* while a position of the insulator 271*a* is fixed. That is, it is possible to adjust the gap distance 273*a* without changing an inner atmosphere of the process vessel 202. In the present specification, the term "inner atmosphere of the process vessel 202" may refer to an inner pressure of the process vessel 202 or a concentration of the gas in the process vessel 202. That is, it is possible to adjust the gap distance 273*a* while the inner pressure of the process vessel 202 is maintained.

(g) According to the present embodiment, it is possible to adjust the position of the coil 253*a* while the position of the insulator 271*a* is fixed. As a result, it is possible to eliminate a flow of the gas in the process chamber 201 and a movement of molecules of the gas caused by a movement of the insulator 271*a*. Thus, it is possible to selectively adjust an influence of the distribution of the plasma on a uniformity of a processing such as the substrate processing. Thereby, it is possible to easily specify the process conditions for improving a uniformity of the substrate processing.

Second Embodiment

Subsequently, a second embodiment according to the technique of the present disclosure will be described with reference to the drawings.

A substrate processing apparatus 100A of the second embodiment of the present disclosure is different from the substrate processing apparatus 100 of the first embodiment in a configuration of a plasma generator. Since other configurations of the second embodiment are substantially the same as those of the first embodiment, the plasma generator of the second embodiment will be mainly described.

Figure 7:
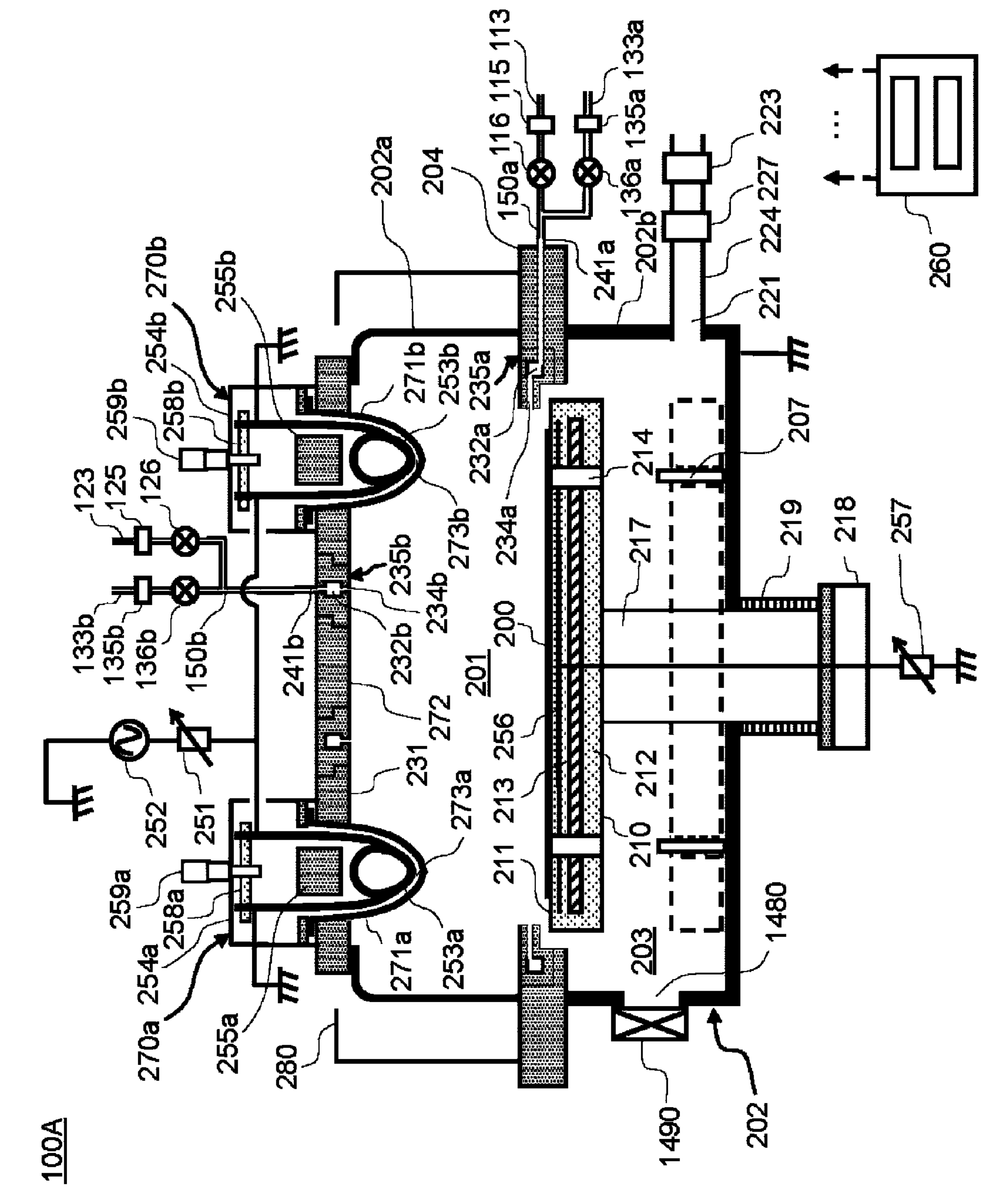
FIG. 7 is a diagram schematically illustrating a substrate processing apparatus according to a second embodiment of the present disclosure.

As shown in FIG. 7, the substrate processing apparatus 100A is provided with two plasma generators 270*a* and 270*b* which are arranged above the upper vessel 202*a* and which partially protrude into the process chamber 201. For example, the plasma generator 270*a* (and the plasma generator 270*b*) is constituted by: the insulator 271*a* (and an insulator 271*b*) fixed to the lid 231; the coil 253*a* (and a coil 253*b*) arranged in the vicinity of the insulator 271*a* (and the insulator 271*b*); the first electromagnetic wave shield 254*a* (and a first electromagnetic wave shield 254*b*) and the second electromagnetic wave shield 255*a* (and a second electromagnetic wave shield 255*a*) arranged above the coil 253*a* (and the coil 253*b*) to cover the coil 253*a* (and the coil 253*b*); the reinforcing structure (or the fixing structure) 258*a* (and an reinforcing structure 258*b*) reinforced by fixing both ends of the coil 253*a* (and both ends of the coil 253*b*) with the insulating material such as the resin; and the micrometer 259*a* (and a micrometer 259*b*) including the shaft (and a shaft) fixed to the first electromagnetic wave shield 254*a* (and the first electromagnetic wave shield 254*b*) and moving vertically while rotating.

For example, each of the insulators 271*a* and 271*b* is made of the insulating material such as quartz and alumina, and is provided at the upper portion of the process chamber 201 so as to protrude toward the inner space of the process chamber 201. The portion of the insulator 271*a* (and a portion of the insulator 271*b*) arranged to protrude toward the inner space of the process chamber 201 (that is, the lower portion of the insulator 271*a* and a lower portion of the insulator 271*b*) is provided with the curved surface constituting a hemispherical shape or a semi-spheroid shape. Further, the inner atmosphere and the outer atmosphere of the insulator 271*a* (and an inner atmosphere and an outer atmosphere of the insulator 271*b*) are isolated from each other by the vacuum seal.

For example, the coil 253*a* (and the coil 253*b*) is configured as the conductive metal pipe, and includes the spiral-shaped portion (and a spiral-shaped portion) extending in the horizontal direction (in a depth direction in FIG. 7). For example, the spiral-shaped portion of the coil 253*a* (and the coil 253*b*) is configured as a circular shape with 1.5 winding turns (that is, the conductive metal pipe constituting the coil 253*a* or 253*b* is wound 1.5 times in a circular shape so as to form the spiral-shaped portion), and the side portion and the bottom portion of the spiral-shaped portion of the coil 253*a* (and a side portion and a bottom portion of the spiral-shaped portion of the coil 253*b*) is located along the curved surface of the insulator 271*a* (and the curved surface of the insulator 271*b*). That is, the coil 253*a* (and the coil 253*b*) is shaped such that the contour and the curvature of the curved surface of the coil 253*a* (and a curved surface of the coil 253*b*) approximately fit into the curved surface of the insulator 271*a* (and the curved surface of the insulator 271*b*). Similar to the first embodiment, the coil 253*a* (and the coil 253*b*) is not limited to the configuration described above including the spiral-shaped portion with 1.5 winding turns, and may include the spiral-shaped portion of at least 0.5 winding turn.

The first end (one end) of the coil 253*a* (and a first end of the coil 253*b*) is connected to the matcher 251 and the high frequency power supply 252, and a second end (the other end) of the coil 253*a* (and a second end of the coil 253*b*) is connected to the ground. The first electromagnetic wave shield 254*a* and the second electromagnetic wave shield 255*a* (and the first electromagnetic wave shield 254*b* and the second electromagnetic wave shield 255*b*) are also connected to the ground. The high frequency power from the high frequency power supply 252 is applied between the first end of the coil 253*a* (and the first end of the coil 253*b*) connected to the matcher 251 and the ground to which the second end of the coil 253*a* (the second end of the coil 253*b*), the first electromagnetic wave shield 254*a* and the second electromagnetic wave shield 255*a* (and the first electromagnetic wave shield 254*b* and the second electromagnetic wave shield 255*b*) are connected.

Each of the first electromagnetic wave shield 254*a* and the second electromagnetic wave shield 255*a* (and each of the first electromagnetic wave shield 254*b* and the second electromagnetic wave shield 255*b*) is configured as the conductive metal plate, and of a cylindrical shape or of a rectangular parallelepiped shape. That is, by including the first electromagnetic wave shield 254*a* and the second electromagnetic wave shield 255*a* (and the first electromagnetic wave shield 254*b* and the second electromagnetic wave shield 255*b*), the plasma generator 270*a* (and the plasma generator 270*b*) is shielded by the conductive metal plate of the cylindrical shape or of the rectangular parallelepiped shape.

According to the plasma generator 270*a* (and the plasma generator 270*b*) configured as described above, when the process gas (in particular, the reactive gas serving as the second process gas) is supplied to the process chamber 201, the process gas is induced by the alternating magnetic field created by the coil 253*a* (and the coil 253*b*), and thereby, the inductively coupled plasma (abbreviated as "ICP") is generated. That is, each of the plasma generator 270*a* and the plasma generator 270*b* is configured to generate the plasma of the process gas within the process chamber 201. Thus, when each of the plasma generator 270*a* and the plasma generator 270*b* generates the plasma, it is possible to greatly improve the amount of the active species generated in the second process gas (that is, the reactive gas) as compared with a case where the plasma generator 270*a* alone is used to generate the plasma in the first embodiment.

The shaft of the micrometer 259*a* of the plasma generator 270*a* (and the shaft of the micrometer 259*b* of the plasma generator 270*b*) is fixed to the reinforcing structure (or the fixing structure) 258*a* (and the reinforcing structure 258*b*) via the bearing (and a bearing) (not shown). Further, by rotating the micrometer 259*a* (and the micrometer 259*b*), the reinforcing structure 258*a* and the coil 253*a* (and the reinforcing structure 258*b* and the coil 253*b*) are moved together in the vertical direction. Thereby, it is possible to adjust the gap distance 273*a* between the coil 253*a* and the insulator 271*a* (and a gap distance 273*b* between the coil 253*b* and the insulator 271*b*). That is, the micrometer 259*a* and the reinforcing structure 258*a* are configured to function as the gap adjusting structure capable of adjusting the gap distance 273*a* between the coil 253*a* and the insulator 271*a*, and the micrometer 259*b* and the reinforcing structure 258*b* are configured to function as a gap adjusting structure capable of adjusting the gap distance 273*b* between the coil 253*b* and the insulator 271*b*. Therefore, when the gap distance 273*a* (and the gap distance 273*b*) is capable of being adjusted by using the micrometer 259*a* (and the micrometer 259*b*), it is possible to adjust the plasma generation efficiency of the plasma generator 270*a* (and the plasma generator 270*b*). Thereby, it is also possible to control characteristics such as the density and the diffusion of the plasma. The present embodiment is described by way of an example in which the micrometers 259*a* and 259*b* and the reinforcing structures 258*a* and 258*b* are provided at the plasma generators 270*a* and 270*b*, respectively. However, the present embodiment is not limited thereto. For example, the micrometer 259*a* and the reinforcing structure 258*a* may provided at the plasma generator 270*a* without providing the micrometer 259*b* and the reinforcing structure 258*b* at the plasma generator 270*b*, or the micrometer 259*b* and the reinforcing structure 258*b* may provided at the plasma generator 270*b* without providing the micrometer 259*a* and the reinforcing structure 258*a* at the plasma generator 270*a*.

When the gap distance 273*a* (and the gap distance 273*b*) is capable of being adjusted by rotating the micrometer 259*a* (and the micrometer 259*b*) as described above, it is possible to uniformize the distribution of the plasma in the process chamber 201. Thereby, it is possible to uniformly supply the active species of the activated second process gas (that is, the reactive gas) onto the surface of the wafer 200. Thus, it is possible to uniformly form the film such as the SiN film on the surface of the wafer 200. Moreover, when the gap distances 273*a* and 273*b* are capable of being adjusted by rotating the micrometers 259*a* and 259*b* in each of the plasma generators 270*a* and 270*b*, respectively, as compared with a case where a control of the distribution of the plasma in the process chamber 201 is performed in only one of the plasma generators 270*a* and 270*b*, it is possible to perform the control more precisely. Therefore, it is possible to effectively and uniformly form the film such as the SiN film on the surface of the wafer 200.

The present embodiment is described by way of the example in which the two plasma generators 270*a* and 270*b* are provided. However, the present embodiment is not limited thereto. For example, depending on the distribution of the plasma in the process chamber 201, three or more plasma generators may be provided, the plasma generators may be unevenly distributed, or a plurality of types including combinations thereof may be provided.

Third Embodiment

Subsequently, a third embodiment according to the technique of the present disclosure will be described with reference to the drawings.

A substrate processing apparatus 100B of the third embodiment of the present disclosure is different from the substrate processing apparatus 100 of the first embodiment in a hardware configuration of an entirety of the substrate processing apparatus 100B. That is, the substrate processing apparatus 100B according to the third embodiment of the present disclosure is obtained by introducing a plasma generator into a so-called vertical type substrate processing apparatus instead of the single wafer type substrate processing apparatus described above.

Figure 8:
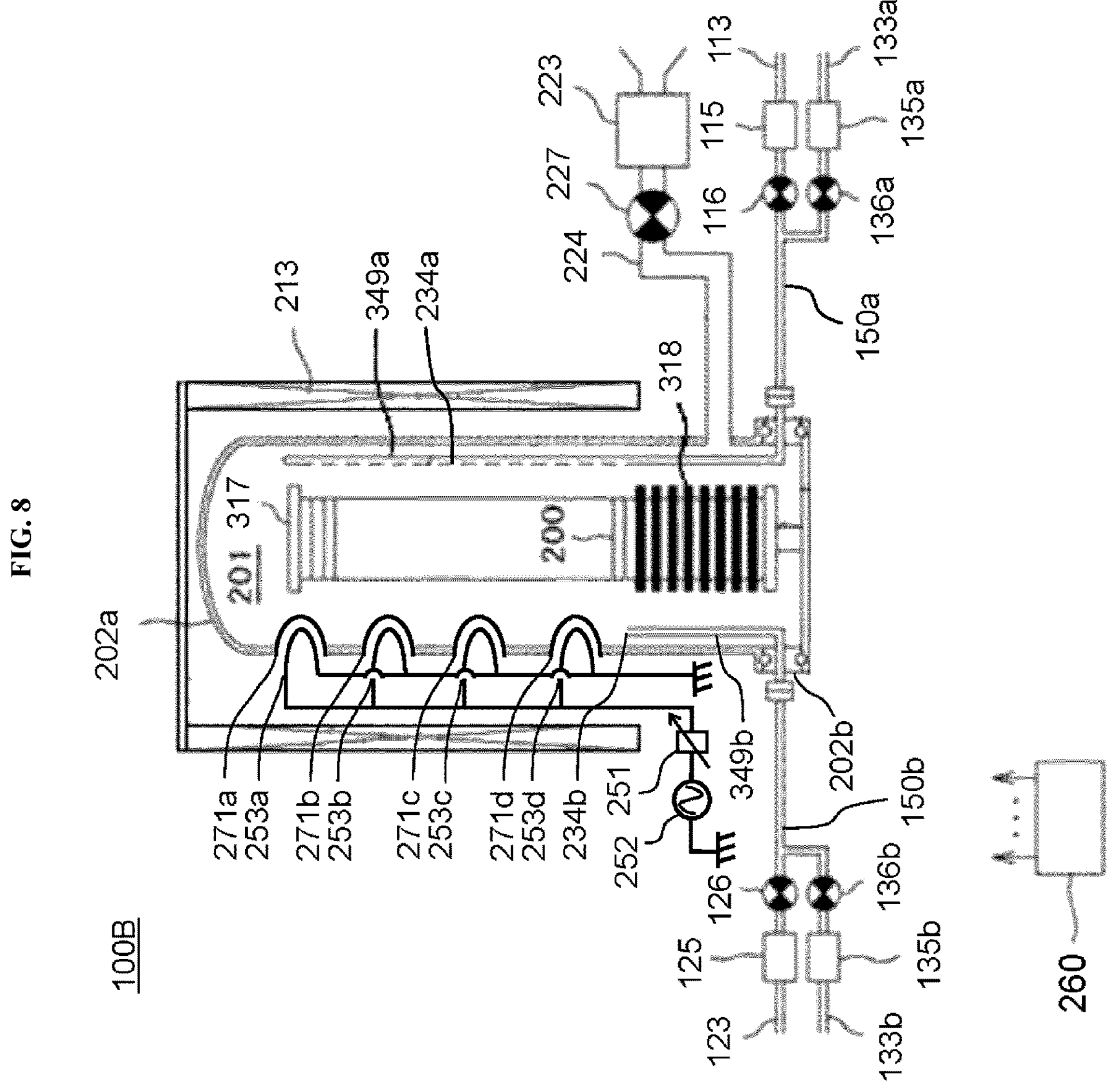
FIG. 8 is a diagram schematically illustrating a substrate processing apparatus according to a third embodiment of the present disclosure.

As shown in FIG. 8, in the substrate processing apparatus 100B, a boat (which is a substrate retainer or a substrate holder) 317 capable of stacking a plurality of wafers including the wafer 200 in the vertical direction; and a heat insulating plate 318 capable of suppressing a heat escape to a lower portion of a reaction chamber (that is, a process chamber 201) are additionally provided. Further, instead of the first gas distributor 235*a* and the second gas distributor 235*b* of the first embodiment, a gas nozzle 349*a* connected to the first gas supply pipe 150*a* and a gas pipe 349*b* connected to the second gas supply pipe 150*b* are provided. Since other configurations of the third embodiment such as a configuration of supplying the gas and a configuration of exhausting the gas are substantially the same as those of the first embodiment, the plasma generator of the third embodiment will be mainly described.

In the substrate processing apparatus 100B, insulators 271*a*, 271*b*, 271*c* and 271*d* of a hemispherical shape welded to a side surface of the upper vessel 202*a* at regular intervals in the vertical direction are provided so as to protrude into the process chamber 201. Coils 253*a*, 253*b*, 253*c* and 253*d* configured as conductive metal pipes and of a semicircular shape with 0.5 winding turn are inserted into the insulators 271*a*, 271*b*, 271*c* and 271*d*, respectively. The high frequency power from the high frequency power supply 252 is supplied (or applied) between a first end (one end) of each of the coils 253*a*, 253*b*, 253*c* and 253*d* connected in parallel to the matcher 251 and the ground to which a second end (the other end) of each of the coils 253*a*, 253*b*, 253*c* and 253*d* is connected.

In the substrate processing apparatus 100B described above, when the reactive gas is supplied to the process chamber 201, the reactive gas is induced by an alternating magnetic field created by the coils 253*a*, 253*b*, 253*c* and 253*d*, and thereby, the inductively coupled plasma (ICP) is generated. When generating the ICP, by fine-tuning at least one of distances from the insulators 271*a*, 271*b*, 271*c* and 271*d* to the coils 253*a*, 253*b*, 253*c* and 253*d* by using the micrometer and the reinforcing structure (or the fixing structure) serving as the adjusting structure described above, it is possible to control the distribution of the plasma in the vertical direction within the reaction chamber (that is, the process chamber 201).

The shape and the number of the insulators and the shape and the number of the coils are not limited to those described above. For example, based on the distribution of the plasma, various combinations of the shape and the number of the insulators and the shape and the number of the coils may be performed. Thereby, it is possible to greatly improve the amount of the active species generated in the reactive gas.

Other Embodiments of Present Disclosure

While the technique of the present disclosure is described in detail by way of the first embodiment, the second embodiment and the third embodiment described above, the technique of the present disclosure is not limited thereto. The technique of the present disclosure may be modified in various ways without departing from the scope thereof.

For example, the embodiments described above are described by way of an example in which the reactive gas is supplied after the source gas is supplied and the film is formed by alternately supplying the source gas and the reactive gas. However, the technique of the present disclosure is not limited thereto. For example, the technique of the present disclosure may also be applied when a supply order of the source gas and the reactive gas is changed or when a supply method in which a supply timing of the source gas and a supply timing of the reactive gas overlap at least partially is used. By changing the supply order of the process gas such as the source gas and the reactive gas or by using the supply method described above, it is possible to change a quality or a composition of the film formed by performing the substrate processing.

For example, the embodiments described above are described by way of an example in which the silicon nitride film (SiN film) is formed on the wafer 200 by using the DCS gas serving as the silicon-containing gas (which is the source gas) and the NH3 gas serving as a nitrogen-containing gas (which is the reactive gas). However, the technique of the present disclosure is not limited thereto. For example, the technique of the present disclosure may also be applied to form a film containing oxygen or a film containing carbon by using different gases other than the DCS gas and the NH3 gas described above. For example, the technique of the present disclosure may also be preferably applied to form, on the wafer 200, a silicon-based oxide film or a silicon-based carbide film such as a silicon oxide film (SiO film), a silicon carbide film (SiC film), a silicon oxycarbide film (SiOC film), a silicon oxycarbonitride film (SiOCN film) and a silicon oxynitride film (SiON film).

Instead of or in addition to the DCS gas, for example, an inorganic halosilane source gas such as monochlorosilane (SiH3Cl, abbreviated as MCS) gas, trichlorosilane (SiHCl3, abbreviated as TCS) gas, tetrachlorosilane, that is, silicon tetrachloride (SiCl4, abbreviated as STC) gas, hexachlorodisilane (Si2Cl6, abbreviated as HCDS) gas and octachlorotrisilane (Si3Cl8, abbreviated as OCTS) gas may be preferably used as the source gas. Instead of or in addition to the DCS gas, for example, an aminosilane source gas such as tetrakis (dimethylamino) silane (Si[N(CH3)2]4, abbreviated as 4DMAS) gas, tris (dimethylamino) silane (Si[N(CH3)2]3H, abbreviated as 3DMAS) gas, bis (dimethylamino) silane (Si[N(CH3)2]2H2, abbreviated as BDMAS), bis (diethylamino) silane (Si[N(C2H5)2]2H2, abbreviated as BDEAS) gas, bis (tertiarybutylamino) silane (SiH2[NH(C4H9)]2, abbreviated as BTBAS) gas, dimethylaminosilane (DMAS) gas, diethylaminosilane (DEAS) gas, dipropylaminosilane (DPAS) gas, diisopropylaminosilane (DIPAS) gas, butylaminosilane (BAS) gas and hexamethyldisilazane (HMDS) gas may be preferably used as the source gas. Instead of or in addition to the DCS gas, for example, an organic silane source gas such as monomethylsilane (Si(CH3)H3, abbreviated as MMS) gas, dimethylsilane (Si(CH3)2H2, abbreviated as DMS) gas, trimethylsilane (Si(CH3)3H, abbreviated as 3MS) gas, tetramethylsilane (Si(CH3)4, abbreviated as 4MS) gas and 1,4 disilabutane (abbreviated as 1,4DSB) gas may be preferably used as the source gas. Instead of or in addition to the DCS gas, for example, an inorganic silane source gas free of a halogen group such as monosilane (SiH4, abbreviated as MS) gas, disilane (Si2H6, abbreviated as DS) gas and trisilane (Si3H8, abbreviated as TS) gas may be preferably used as the source gas. An aminosilane source material of the aminosilane source gas refers to a silane source material containing an amino group, also refers to a silane source material containing an alkyl group such as a methyl group, an ethyl group and a butyl group, and also refers to a source material containing at least silicon (Si), nitrogen (N) and carbon (C). That is, the aminosilane source material in the present specification may refer to an organic source material or an organic aminosilane source material.

Instead of or in addition to the NH3 gas, for example, a nitrogen-containing gas such as nitrogen gas, diazene (N2H2) gas, hydrazine (N2H4) gas and N3H8 gas may be preferably used as the reactive gas. Further, for example, an amine-based gas may also be used as the nitrogen-containing gas. The amine-based gas refers to a gas containing an amine group, and also refers to a gas containing at least carbon (C), nitrogen (N) and hydrogen (H). The amine-based gas contains an amine such as ethylamine, methylamine, propylamine, isopropylamine, butylamine and isobutylamine. In the present specification, the amine collectively or individually refers to compounds in which a hydrogen atom of ammonia (NH3) is substituted with a hydrocarbon group such as an alkyl group. That is, the amine contains the hydrocarbon group such as the alkyl group. Since the amine-based gas does not contain silicon (Si), the amine-based gas may also be referred to as a "silicon-free gas". Further, since the amine-based gas does not contain silicon (Si) and a metal, the amine-based gas may also be referred to as a "gas free of silicon and free of metal". For example, an ethylamine-based gas such as triethylamine ((C2H5)3N, abbreviated as TEA), diethylamine ((C2H5)2NH, abbreviated as DEA) and monoethylamine (C2H5NH2, abbreviated as MEA) may be preferably used as the amine-based gas. For example, a methylamine-based gas such as trimethylamine ((CH3)3N, abbreviated as TMA), dimethylamine ((CH3)2NH, abbreviated as DMA) and monomethylamine (CH3NH2, abbreviated as MMA) may be preferably used as the amine-based gas. For example, a propylamine-based gas such as tripropylamine ((C3H7)3N, abbreviated as TPA), dipropylamine ((C3H7)2NH, abbreviated as DPA) and monopropylamine (C3H7NH2, abbreviated as MPA) may be preferably used as the amine-based gas. For example, an isopropylamine-based gas such as triisopropylamine ([(CH3)2CH]3N, abbreviated as TIPA), diisopropylamine ([(CH3)2CH]2NH, abbreviated as DIPA) and monoisopropylamine ((CH3)2CHNH2, abbreviated as MIPA) may be preferably used as the amine-based gas. For example, a butylamine-based gas such as tributylamine ((C4H9)3N, abbreviated as TBA), dibutylamine ((C4H9)2NH, abbreviated as DBA) and monobutylamine (C4H9NH2, abbreviated as MBA) may be preferably used as the amine-based gas. For example, an isobutylamine-based gas such as triisobutylamine ([(CH3)2CHCH2]3N, abbreviated as TIBA), diisobutylamine ([(CH3)2CHCH2]2NH, abbreviated as DIBA) and monoisobutylamine ((CH3)2CHCH2NH2, abbreviated as MIBA) may be preferably used as the amine-based gas. That is, for example, at least one gas selected from the group of (C2H5)xNH3-x, (CH3)xNH3-x, (C3H7)xNH3-x, [(CH3)2CH]xNH3-x, (C4H9)xNH3-x and [(CH3)2CHCH2]xNH3-x (wherein x is an integer from 1 to 3) may be preferably used as the amine-based gas. The amine-based gas acts as a nitrogen source when forming the film such as the SiN film, the SiCN film and the SiOCN film, and also acts as a carbon source. By using the amine-based gas as the nitrogen-containing gas, it is possible to control carbon component in the film such that an amount of the carbon components in the film is increased. For example, an oxidizing agent (or an oxidizing gas), that is, an oxygen-containing gas serving as an oxygen source may also be used as the reactive gas. For example, the oxygen-containing gas such as oxygen ($O_2$) gas, water vapor ($H_2O$ gas), nitrous oxide ($N_2O$) gas, nitric oxide (NO) gas, nitrogen dioxide ($NO_2$) gas, ozone ($O_3$) gas, hydrogen peroxide ($H_2O_2$) gas, carbon monoxide (CO) gas and carbon dioxide ($CO_2$) gas may also be preferably used as the reactive gas.

The technique of the present disclosure may also be preferably applied to form a metalloid film containing a metalloid element or a metal-based film containing a metal element. Process sequences and process conditions of a film-forming process of forming the metalloid film or the metal-based film may be substantially the same as those of the film-forming process according to the embodiments or modified examples described above. Even in such a case, it is possible to obtain substantially the same effects as the embodiments described above. The technique of the present disclosure may also be applied to form, on the wafer 200, a metal-based oxide film or a metal-based nitride film containing a metal element such as titanium (Ti), zirconium (Zr), hafnium (Hf), tantalum (Ta), niobium (Nb), aluminum (Al), molybdenum (Mo) and tungsten (W). That is, the technique of the present disclosure may also be applied to form, on the wafer 200, a film such as a TiO film, a TiOC film, a TiOCN film, a TiON film, a TiN film, a TiCN film, a ZrO film, a ZrOC film, a ZrOCN film, a ZrON film, a ZrN film, a ZrCN film, a HfO film, a HfOC film, a HfOCN film, a HfON film, a HfN film, a HfCN film, a TaO film, a TaOC film, a TaOCN film, a TaON film, a TaN film, a TaCN film, a NbO film, a NbOC film, a NbOCN film, a NbON film, a NbN film, a NbCN film, an AlO film, an AlOC film, an AlOCN film, an AlON film, an AN film, an AlCN film, a MoO film, a MoOC film, a MoOCN film, a MoON film, a MoN film, a MoCN film, a WO film, a WOC film, a WOCN film, a WON film, a WN film and a WCN film. For example, various gases such as tetrakis (dimethylamino) titanium ($Ti[N(CH_3)_2]_4$, abbreviated as TDMAT) gas, tetrakis (ethylmethylamino) hafnium ($Hf[N(C_2H_5)(CH_3)]_4$, abbreviated as TEMAH) gas, tetrakis (ethylmethylamino) zirconium ($Zr[N(C_2H_5)(CH_3)]_4$, abbreviated as TEMAZ) gas, trimethylaluminum ($Al(CH_3)_3$, abbreviated as TMA) gas, titanium tetrachloride ($TiCl_4$) gas and hafnium tetrachloride ($HfCl_4$) gas may be used as the source gas to form the metal-based oxide film or the metal-based nitride film described above.

The embodiments described above are described by way of an example in which the film-forming process is performed. However, the technique of the present disclosure is not limited thereto. For example, the technique of the present disclosure may also be applied to other processes instead of the film-forming process. That is, the technique of the present disclosure may also be applied to a process using the plasma such as a diffusion process, an oxidation process, a nitridation process, an oxynitridation process, a reduction process, an oxidation-reduction process, an etching process and a heating process. For example, the technique of the present disclosure may also be applied to a plasma oxidation process, a plasma nitridation process or a plasma modification process for the surface of the substrate or a film formed on the substrate using the reactive gas alone. Further, the technique of the present disclosure may also be applied to a plasma annealing process using the reactive gas alone.

The embodiments described above are described by way of an example in which the manufacturing process of the semiconductor device is performed. However, the technique of the present disclosure is not limited thereto. For example, the technique of the present disclosure may be applied to other manufacturing processes. For example, the technique of the present disclosure may be applied to various substrate processings such as a manufacturing process of a liquid crystal device, a manufacturing process of a solar cell, a manufacturing process of a light emitting device, a processing of a glass substrate, a processing of a ceramic substrate and a processing of a conductive substrate.

The first embodiment and the second embodiment described above are described by way of an example in which the substrate processing apparatus is configured to process a single substrate in a single process chamber. However, the technique of the present disclosure is not limited thereto. For example, the technique of the present disclosure may also be applied to a substrate processing apparatus in which a plurality of substrates are arranged in the horizontal direction or the vertical direction.

It is preferable that recipes used in the film-forming process are prepared individually in accordance with process contents and stored in the memory **260*c* via an electric communication line or the external memory 262. When starting various processes, it is preferable that the CPU 260*a* selects an appropriate recipe among the recipes stored in the memory 260*c* in accordance with the process contents. Thus, various films of different composition ratios, qualities and thicknesses can be formed in a reproducible manner and in a universal manner by using a single substrate processing apparatus. In addition, since a burden on an operating personnel of the substrate processing apparatus can be reduced, various processes can be performed quickly while avoiding a malfunction of the substrate processing apparatus. The recipe described above is not limited to creating a new recipe. For example, the recipe may be prepared by changing an existing recipe stored in the substrate processing apparatus in advance. When changing the existing recipe to a new recipe, the new recipe may be installed in the substrate processing apparatus via the electric communication line or the recording medium in which the new recipe is stored. Further, the existing recipe already stored in the substrate processing apparatus may be directly changed to the new recipe by operating the input/output device 261** of the substrate processing apparatus.

According to some embodiments of the present disclosure, it is possible to forming the uniform film on the surface of the substrate.

What is claimed is:

1. A substrate processing apparatus comprising:

a process chamber in which a substrate is processed;

a gas supplier through which a process gas is supplied to the process chamber;

a plasma generator including an insulator provided with a curved surface so as to protrude into the process chamber, and a coil having a shape that approximately fits into the curved surface of the insulator, and configured to generate a plasma of the process gas in the process chamber;

an adjuster capable of adjusting a gap distance between the coil and the insulator; and a shield arranged above the coil to cover the coil, wherein the shield comprises:

a first shield arranged so as to cover an upper side of the coil; and a second shield provided inside the plasma generator, wherein the second shield is provided between opposite ends of the coil.

2. The substrate processing apparatus of claim 1, wherein the coil is provided with a spiral-shaped portion of at least 0.5 winding turn.

3. The substrate processing apparatus of claim 1, wherein the insulator is provided so as to protrude into the process chamber, and is of a hemispherical shape or a semi-spheroid shape.

4. The substrate processing apparatus of claim 1, wherein each of the first and second shields comprises a conductive metal plate of a cylindrical shape or of a rectangular parallelepiped shape.

5. The substrate processing apparatus of claim 1, wherein the adjuster comprises a moving structure capable of vertically moving the coil.

6. The substrate processing apparatus of claim 5, wherein the moving structure comprises a micrometer, and wherein the coil is vertically moved by rotating the micrometer.

7. The substrate processing apparatus of claim 5, wherein the coil is fixed to a fixing structure, and wherein the moving structure is configured to vertically move the fixing structure.

8. The substrate processing apparatus of claim 7, wherein the coil and the adjuster are arranged inside the shield.

9. The substrate processing apparatus of claim 8, wherein the fixing structure is made of an insulating material, and fixes both ends of the coil.

10. The substrate processing apparatus of claim 1, wherein the plasma generator is provided above the process chamber.

11. The substrate processing apparatus of claim 1, further comprising:

one or more plasma generators, wherein each of the one or more plasma generators is provided so as to protrude into the process chamber, constituted by a coil and an insulator and configured to generate the plasma of the process gas in the process chamber.

12. The substrate processing apparatus of claim 1, wherein a first end of the coil is connected to a matcher and a high frequency power supply, and a second end of the coil is connected to a ground.

13. The substrate processing apparatus of claim 1, wherein the shield is connected to a ground.

14. The substrate processing apparatus of claim 1, wherein an efficiency of generating the plasma is capable of being changed by adjusting the gap distance between the coil and the insulator by using the adjuster.

15. The substrate processing apparatus of claim 1, wherein the plasma generator comprises a reinforcing member, wherein ends of the coil are fixed by the reinforcing member.

16. The substrate processing apparatus of claim 1, wherein one end of the coil is connected to a ground, and wherein the first shield and the second shield are connected to the ground.

17. The substrate processing apparatus of claim 1, wherein the gap distance between the coil and the insulator is adjusted by the adjuster such that a plasma distribution in the process chamber becomes uniform in a horizontal direction on the substrate.

18. A method of manufacturing a semiconductor device, comprising:

(a) loading a substrate into a process chamber of a substrate processing apparatus, wherein the substrate processing apparatus comprises:

the process chamber in which the substrate is processed;

a gas supplier through which a process gas is supplied to the process chamber;

a plasma generator including an insulator provided with a curved surface so as to protrude into the process chamber, and a coil having a shape that approximately fits into the curved surface of the insulator, and configured to generate a plasma of the process gas in the process chamber;

a shield arranged above the coil to cover the coil, wherein the shield comprises:

a first shield arranged so as to cover an upper side of the coil; and a second shield provided inside the plasma generator, wherein the second shield is provided between opposite ends of the coil; and an adjuster capable of adjusting a gap distance between the coil and the insulator; and (b) generating the plasma of the process gas in the process chamber by the plasma generator.

19. A plasma generating apparatus comprising:

a plasma generator including an insulator provided with a curved surface so as to protrude into a process chamber in which a substrate is processed, and a coil having a shape that approximately fits into the curved surface of the insulator, and configured to generate a plasma of a process gas in the process chamber;

a shield arranged above the coil to cover the coil, wherein the shield comprises:

a first shield arranged so as to cover an upper side of the coil; and a second shield provided inside the plasma generator, wherein the second shield is provided between opposite ends of the coil; and an adjuster capable of adjusting a gap distance between the coil and the insulator.

* * * * *